(12) United States Patent
Ogawa

(10) Patent No.: US 7,167,608 B2
(45) Date of Patent: Jan. 23, 2007

(54) HYBRID CIRCUIT SUBSTRATE WITH OPTICAL AND ELECTRICAL INTERCONNECTS, HYBRID CIRCUIT MODULE WITH OPTICAL INTERCONNECTS AND MANUFACTURING METHODS THEREOF

(75) Inventor: Tsuyoshi Ogawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/322,710

(22) Filed: Dec. 30, 2005

(65) Prior Publication Data
US 2006/0110099 A1 May 25, 2006

Related U.S. Application Data

(62) Division of application No. 10/691,085, filed on Oct. 22, 2003.

(30) Foreign Application Priority Data
Oct. 24, 2002 (JP) .............................. 2002-309977

(51) Int. Cl.
*G02B 6/12* (2006.01)
(52) U.S. Cl. ......................................... 385/14; 385/88
(58) Field of Classification Search ................. 385/14, 385/88–94, 130–132
See application file for complete search history.

(56) References Cited

U.S. PATENT DOCUMENTS 6,829,398 B1 * 12/2004 Ouchi .......................... 385/14

* cited by examiner

*Primary Examiner*—Kevin S. Wood
(74) *Attorney, Agent, or Firm*—Sonnenschein Nath & Rosenthal LLP

(57) ABSTRACT

Transmission of electric and optical signal, realization of high-speed and high capacity of transmission of information signals. A base substrate section having an interconnect layer formed on an insulating substrate by a printed circuit process; a micro interconnect circuit section having a micro electrical interconnect layer which is finer than the interconnect layer of the base substrate section, formed on an insulating resin layer by a semiconductor process; and an optical interconnect circuit section adapted to transfer and/or receive an optical signal and provided with an optical wave-guide having an input section and an output section of a optical signal at opposite ends thereof; and at least a pair of optical elements composed of a light emitting device with a light emitting section thereof facing the input section and a photo detecting device with a photo detecting section thereof facing the output section are provided and the micro interconnect circuit section and the optical interconnect circuit section are mounted on the base substrate section.

11 Claims, 37 Drawing Sheets

HYBRID CIRCUIT SUBSTRATE WITH OPTICAL AND ELECTRICAL INTERCONNECTS, HYBRID CIRCUIT MODULE WITH OPTICAL INTERCONNECTS AND MANUFACTURING METHODS THEREOF

CROSS REFERENCE TO RELATED APPLICATIONS

This application is a divisional of U.S. application Ser. No. 10/691,085, filed Oct. 22, 2003, fully incorporated herein by reference to this extent permitted by law, which is based on Japanese Priority Application JP2002-309977, filed in the Japanese Patent Office on Oct. 24, 2002, the contents of which being incorporated herein by reference to the extent permitted by law.

BACKGROUND OF THE INVENTION

1. Field of the Invention

The preferred embodiment of the present invention relates to a hybrid circuit substrate with embedded optical and electrical interconnects, and, more particularly, to a hybrid circuit substrate, which may achieve increased transmission speed with increased capacity of an information signal under high speed and with increased capacity by enabling transmission of an electrical signals and a photo optical signals. Also, the preferred embodiment of the present invention relates to a method for manufacturing the above hybrid circuit substrate. Further, the preferred embodiment of the present invention relates to a hybrid circuit module with optical and electrical interconnects embedded and a method for manufacturing the above hybrid circuit module.

2. Description of the Related Art

A variety of digital electronic appliances such as portable computers, mobile phones, video apparatuses and audio apparatuses, for instance, are equipped with a multi-chip circuit module with various semiconductor chips such as IC (Integrated Circuit) elements and LSI (Large Scale Integration) elements packaged. In the circuit module, increased functionality and flexibility of combination with downsizing, may be accomplished through increasing interconnect pattern micro-fabrication, IC package downsizing, fast progressing integration scale, increasing pin multiplication, assembly technology improvement and the like. In addition, in the circuit module, performance, functionality, multi-functionality and high speed processing, etc. are also being increased with sharply increasing operation speed of the semiconductor chips with increased capacity and the like.

In the circuit module, relatively short-distance transmission of an information signal between boards or intra-board semiconductor chips and the like takes place typically with an electrical signal transmitted through electrical interconnects. In the circuit module, efforts to further increase transmission performance is being made for high speed transmission of the information signal and increasing density of a signal pattern and the like. However, there is a limit in an approach to increased transmission performance with the electrical interconnects, resulting in a difficulty in achieving the increased transmission performance. The circuit module also needs to take measures against problems such as delayed signal transmission caused by a CR (Capacitance-Resistance) time constant that arises in an inter-connect pattern, EMI (Electromagnetic Interference) noise, EMC (Electromagnetic Compatibility), inter-interconnect pattern cross talk and so on.

In the circuit module, use of an optical interconnection technology realized using optical interconnects, interconnections and the like has become popular in order to settle the above transmission problems on the electrical signal with the electrical interconnects. The optical interconnection technology enables transmission of an information signal and the like at high speed between appliances, intra-appliance boards or intra-board semiconductor chips. Particularly, in short-distance transmission such as inter-semiconductor chip transmission of a signal, for instance, the optical interconnection technology ensures configuration of a suitable optical signal transmission system with an optical wave-guide as a transmission line by forming the optical wave-guide on a substrate with the semiconductor chips packaged.

In an optical interconnect circuit module, a circuit substrate thereof is mounted with not only the optical wave-guide, but also a light emitting device that outputs a optical signal into the optical wave-guide through conversion of an electrical signal into the optical signal, and a photo-detecting device that outputs the electrical signal through conversion of the optical signal accepted through the optical wave-guide into the electrical signal, or an IC chip and the like adapted to transfer of the electrical signal between the light emitting device and the photo-detecting device. On one hand, the optical interconnect circuit module is designed to have an electrical interconnect pattern, together with the above optical wave-guide, on the circuit substrate in order to meet low speed control signal transmission and the like, with supply of power to optical elements, so that a hybrid circuit substrate with optical and electrical interconnects embedded is equipped.

The hybrid circuit substrate is configured with the optical wave-guide, as a component of the optical interconnect section, on a main surface of a typical printed circuit board having an appropriate interconnect pattern that configures the electrical interconnect section, for instance. Alternatively, when manufacturing the hybrid circuit substrate at relatively micro scale and high density, a silicon substrate, a quartz substrate or a glass substrate is applied, for instance, to deposit a thin film layer of multi layer interconnection having an interconnect pattern on a main surface of the above substrate, and the optical wave-guide composing the optical interconnect section is formed on the thin film layer of multi layer interconnection.

In the hybrid circuit substrate, the optical wave-guide is formed with a photoconductive polymer compound using a low-temperature process. The hybrid circuit substrate needs to have the optical wave-guide that is free from surface irregularities causing a propagation loss and also meets a highly dimensional accuracy. When the hybrid circuit substrate is designed to have the optical wave-guide directly on the main surface of the silicon substrate and the like having the advantage of providing a small surface roughness enough to ensure satisfactory flatness, it is relatively easy to attain the optical wave-guide having the above characteristics.

SUMMARY OF THE INVENTION

However, in the hybrid circuit substrate, the electrical interconnect section has surface irregularities caused by interconnect pattern plating or depending on a film thickness of a metal foil and the like. Thus, when the electrical interconnect pattern is provided on the main surface of the silicon substrate and the like simultaneously with the optical wave-guide, transfer of the above surface irregularities to the optical wave-guide located on the electrical interconnect section occurs. Thus, the hybrid circuit substrate causes the optical wave-guide to undergo propagation loss worsening, dimensional accuracy degradations and so on. In addition, in the hybrid circuit substrate, fabrication of the optical wave-guide involves immersion of the silicon substrate in an acid, alkaline or organic solvent at the time of wet etching and cleaning, for instance, and also requires dry etching and high temperature heating of the silicon substrate, for instance.

Thus, the hybrid circuit substrate has presented a problem in which the silicon substrate is damaged. Another problem with the hybrid circuit substrate has been that use of the relatively expensive silicon substrate and the like results in an increase in manufacture cost. When electrical connection takes place with the hybrid circuit substrate attached to an assembly board such as a motherboard, for instance, the hybrid circuit substrate finds difficulty in employing a connection structure adapted to connection between a surface deposited with the interconnect layer and a component side through a via hole, resulting in a problem of a need for a complicated interconnection structure that leads to an increase in size.

Incidentally, a printed board is available at relatively low cost and also has adaptability to electrical connection between the surface deposited with the interconnect layer and the component side. However, the printed board is typically limited in interconnect pattern accuracy and the like to a range of about several 10 μm to several 100 μm. With consideration of accurate coupling between optical elements and the optical wave-guide, the hybrid circuit substrate needs not only accurate alignment for the above coupling as high as about several μm, but also a micro-fabricated interconnect pattern with increased accuracy. The hybrid circuit substrate has also posed a problem of a difficulty in employing the printed board for expected micro-fabrication of input/output pads of the semiconductor chips in future and/or pitch reductions due to the increasing number of bus interconnects with the increasing bandwidth between the semiconductor chips.

Accordingly, there is a need for a hybrid circuit substrate with optical and electrical interconnects embedded, more specifically, a hybrid circuit substrate, which is fabricated accurately at low cost, and ensures that high speed transmission with increased capacity of an information signal is achieved by enabling transmission of an electrical signal and a optical signal in such a way as to provide electrical and optical interconnects embedded. There is also a need for a method for manufacturing the above hybrid circuit substrate. There is further a need for a hybrid circuit module with optical and electrical interconnects embedded and also a method for manufacturing the above hybrid circuit module.

A hybrid circuit substrate with optical and electrical interconnects embedded according to a preferred embodiment of the preferred embodiment of the present invention comprises a base substrate section having an interconnect layer deposited on an insulating substrate by a printed circuit process; and a micro interconnect circuit section and an optical interconnect circuit section respectively mounted on the base substrate section. The hybrid circuit substrate with optical and electrical interconnects embedded is characterized in that the micro interconnect circuit section is configured with a micro electrical interconnect layer deposited on an insulating resin layer so as to be micro-fabricated more than the interconnect layer of the base substrate section using a semiconductor process. The hybrid circuit substrate with optical and electrical interconnects embedded is also characterized in that the optical interconnect circuit section is provided with an optical wave-guide having, at the opposite ends thereof, an input section and an output section of a optical signal; and an optical element composed of a light emitting device with a light emitting section thereof facing the input section and a photo detecting device with a photo detecting section thereof facing the output section, and being adapted to transfer of the optical signal.

According to thus-configured hybrid circuit substrate with optical and electrical interconnects embedded in accordance with the preferred embodiment of the preferred embodiment of the present invention, the base substrate section fabricated at relatively low cost using the printed circuit process, the micro interconnect circuit section having the micro electrical interconnect layer micro-fabricated with increased accuracy using the semiconductor process, and the optical interconnect circuit section adaptable to high speed transmission with increased capacity of the information signal and the like using the optical wave-guide are stacked into a multi layer structure, which thus provides a low-cost hybrid circuit substrate having accurate optical and electrical interconnects that achieve high speed transmission with increased capacity of the information signal and the like. According to the preferred embodiment of the preferred embodiment of the present invention, the multi layer structure contributes toward form-factor reductions with electrical interconnect length reductions, and also ensures a sufficient packaging space for semiconductor chips and surface-mounted components and the like, so that multi-functionality or performance is increased. According to the preferred embodiment of the preferred embodiment of the present invention, a hybrid circuit substrate is provided, for instance, which has the advantages of providing the base substrate section having a power supply section and a ground line respectively assembled in a motherboard and the like with a sufficient area ensured, of providing the micro interconnect circuit section electrically connectable to the optical element and/or the semiconductor chips with accuracy and also being capable of deposition of high performance passive elements and the like, for instance, therein, of providing the optical interconnect circuit section having an accurate optical wave-guide and also being capable of accurate coupling between the optical wave-guide and the optical element, and of being applicable to various characteristics in an optimal manner.

In addition, a method for manufacturing a hybrid circuit substrate with optical and electrical interconnects embedded according to the preferred embodiment of the present invention comprises a process of fabrication of a base substrate section; a process of fabrication of a micro interconnect circuit section; a process of fabrication of an optical interconnect circuit section; and an assembly process of mounting the micro interconnect circuit section and the optical interconnect circuit section to the base substrate section. The process of fabrication of the base substrate section is to provide the base substrate section having an interconnect layer deposited on an insulating substrate by a printed circuit process. The process of fabrication of the micro interconnect circuit section is to provide the micro interconnect circuit section having a micro electrical interconnect layer deposited on an insulating resin layer so as to be micro-fabricated more than the interconnect layer of the base substrate section using a semiconductor process. The process of fabrication of the optical interconnect circuit section is to provide the optical interconnect circuit section provided with an optical wave-guide having, at the opposite ends thereof, an input section and an output section of a optical signal and an optical element composed of a light emitting device with a light emitting section thereof facing the input section, and a photo detecting device with a photo detecting section thereof facing the output section, and being adapted to transfer of the optical signal.

According to the method for manufacturing the hybrid circuit substrate with optical and electrical interconnects embedded in accordance with the preferred embodiment of the present invention having the above processes, a hybrid circuit substrate is manufactured, which is configured with a multi layer structure obtained by stacking the base substrate section fabricated at relatively low cost using the printed circuit process, the micro interconnect circuit section having the micro electrical interconnect layer micro-fabricated with increased accuracy using the semiconductor process and the optical interconnect circuit section adaptable to high speed transmission with increased capacity of the information signal and the like using the optical wave-guide. According to the preferred embodiment of the present invention, a low-cost hybrid circuit substrate may be manufactured, which has accurate optical and electrical interconnects that achieve high-speed transmission with increased capacity of the information signal and the like. According to the present invention, a hybrid circuit substrate may be manufactured, in which the multi layer structure obtained by stacking the above sections contributes toward form-factor reductions with electrical interconnect length reductions and also ensures a sufficient packaging space for semiconductor chips and surface-mounted components and the like, so that multi-functionality or performance is increased. According to the preferred embodiment of the present invention, a hybrid circuit substrate may be manufactured, for instance, which has the advantages of providing the base substrate section having a power supply section and a ground line respectively assembled in a motherboard and the like with a sufficient area ensured, of providing the micro interconnect circuit section electrically connectable to the optical element and/or the semiconductor chips with accuracy and also being capable of deposition of high performance passive elements and the like, for instance, therein, of providing the optical interconnect circuit section having an accurate optical wave-guide and also being capable of accurate coupling between the optical wave-guide and the optical element, and of being applicable to various characteristics in an optimal manner.

Further, a hybrid circuit module with optical and electrical interconnects embedded according to the preferred embodiment of the present invention comprises a base substrate section having an interconnect layer deposited on an insulating substrate by a printed circuit process; a micro interconnect circuit section and an optical interconnect circuit section respectively mounted on the base substrate section; and semiconductor chips and electronic components respectively surface-mounted on the base substrate section and the micro interconnect circuit section or the optical interconnect circuit section. The hybrid circuit module with optical and electrical interconnects embedded is characterized in that the micro interconnect circuit section is configured with a micro electrical interconnect layer deposited on an insulating resin layer so as to be micro-fabricated more than the interconnect layer of the base substrate section using a semiconductor process. The hybrid circuit module with optical and electrical interconnects embedded is characterized in that the optical interconnect circuit section is provided with an optical wave-guide having, at the opposite ends thereof, an input section and an output section of a optical signal; and an optical element composed of a light emitting device with a light emitting section thereof facing the input section and a photo detecting device with a photo detecting section thereof facing the output section, and being adapted to transfer of the optical signal.

According to thus-configured hybrid circuit module with optical and electrical interconnects embedded in accordance with the preferred embodiment of the present invention, the base substrate section fabricated at relatively low cost using the printed circuit process, the micro interconnect circuit section having the micro electrical interconnect layer micro-fabricated with increased accuracy using the semiconductor process and the optical interconnect circuit section adaptable to high speed transmission with increased capacity of the information signal and the like using the optical wave-guide are stacked into a multi layer structure, which thus contributes toward form-factor reductions with electrical interconnect length reductions and also ensures a sufficient packaging space for semiconductor chips and surface-mounted components and the like, so that multi-functionality or performance is increased with high speed transmission with increased capacity of the information signal and the like. According to the preferred embodiment of the present invention, a high performance hybrid circuit module is provided, for instance, which has the advantages of providing the base substrate section having a power supply section and a ground line respectively assembled in a motherboard and the like with a sufficient area ensured, of providing the micro interconnect circuit section electrically connectable to the optical element and/or the semiconductor chips with accuracy and also being capable of deposition of high performance passive elements and the like, for instance, therein, of providing the optical interconnect circuit section having an accurate optical wave-guide and also being capable of accurate coupling between the optical wave-guide and the optical element, and of being adaptable to accurate connection to the semiconductor chips and the surface-mounted components and the like in an optimal manner.

Furthermore, a method for manufacturing a hybrid circuit module with optical and electrical interconnects embedded according to the preferred embodiment of the present invention comprises a process of fabrication of a base substrate section; a process of fabrication of a micro interconnect circuit section; a process of fabrication of an optical interconnect circuit section; an assembly process of mounting the micro interconnect circuit section and the optical interconnect circuit section to the base substrate section; and a process of surface-mounting semiconductor chips and surface mount-type electronic components to the base substrate section and the micro interconnect circuit section or the optical interconnect circuit section. The process of fabrication of the base substrate section is to provide the base substrate section having an interconnect layer deposited on an insulating substrate by a printed circuit process. The process of fabrication of the micro interconnect circuit section is to provide the micro interconnect circuit section having a micro electrical interconnect layer deposited on an insulating resin layer so as to be micro-fabricated more than the interconnect layer of the base substrate section using a semiconductor process. The process of fabrication of the optical interconnect circuit section is to provide the optical interconnect circuit section provided with an optical wave-guide having, at the opposite ends thereof, an input section and an output section of a optical signal; and an optical element composed of a light emitting device with a light emitting section thereof facing the input section and a photo detecting device with a photo detecting section thereof facing the output section, and being adapted to transfer of the optical signal.

According to the method for manufacturing the hybrid circuit module with optical and electrical interconnects embedded in accordance with the preferred embodiment of the present invention having the above processes, a hybrid circuit module with optical and electrical interconnects embedded may be manufactured, which is configured with a multi layer structure obtained by stacking the micro interconnect circuit section and the optical interconnect circuit section on a base circuit section of the base substrate section fabricated at relatively low cost using the printed circuit process in such a way that the micro electrical interconnect layer micro-fabricated with increased accuracy using the semiconductor process and the optical element adaptable to high speed transmission with increased capacity of the information signal and the like using the optical wave-guide are electrically connected to the base circuit section, and that the light emitting device is also electrically connected to the semiconductor chips and/or the surface mount-type electronic components. According to the preferred embodiment of the present invention, a hybrid circuit module may be manufactured, which contributes toward form-factor reductions with electrical interconnect length reductions, and ensures a sufficient packaging space for semiconductor chips and surface-mounted components and the like, so that multi-functionality or performance is increased with high speed transmission with increased capacity of the information signal and the like. According to the preferred embodiment of the present invention, a high performance hybrid circuit module may be manufactured, for instance, which has the advantages of providing the base substrate section having a power supply section and a ground line respectively assembled in a motherboard and the like with a sufficient area ensured, of providing the micro interconnect circuit section electrically connectable to the optical element and/or the semiconductor chips with accuracy and also being capable of deposition of high performance passive elements and the like, for instance, therein, of providing the optical interconnect circuit section having an accurate optical wave-guide and also being capable of accurate coupling between the optical wave-guide and the optical element, and of being adaptable to accurate connection to the semiconductor chips and the surface-mounted components and the like in an optimal manner.

BRIEF DESCRIPTION OF THE DRAWINGS

The above and other features and advantages of the present invention will become more apparent from the following description of the presently exemplary preferred embodiment of the present invention taken in conjunction with the accompanying drawings, in which.

DETAILED DESCRIPTION OF THE PREFERRED EMBODIMENTS

Preferred embodiments of the preferred embodiment of the present invention will now be described in detail with reference to the accompanying drawings. A hybrid circuit module 1 with optical and electrical interconnects embedded (which will be hereinafter simply referred to as a circuit module) shown as one embodiment is mounted in various electronic appliances such as portable computers, mobile phones and audio apparatuses with an information communication function and a storage function and the like loaded, for instance. Alternatively, the circuit module 1 is to configure a high frequency circuit section of a micro communication function module detachably mounted as an option. The circuit module 1 provides an electrical interconnect function for electrical transmission of an information signal and a control signal and the like, supply of power and so on, with an optical interconnect function for optical transmission of the information signal and the control signal and the like. The circuit module 1 is designed to apply the electrical interconnect to power supply and control signal transmission that are attainable at low transmission speed without hindrance, with optical interconnect applications to relatively short-distance transmission at high speed with increased capacity of the information signal and the like.

Figure 1:
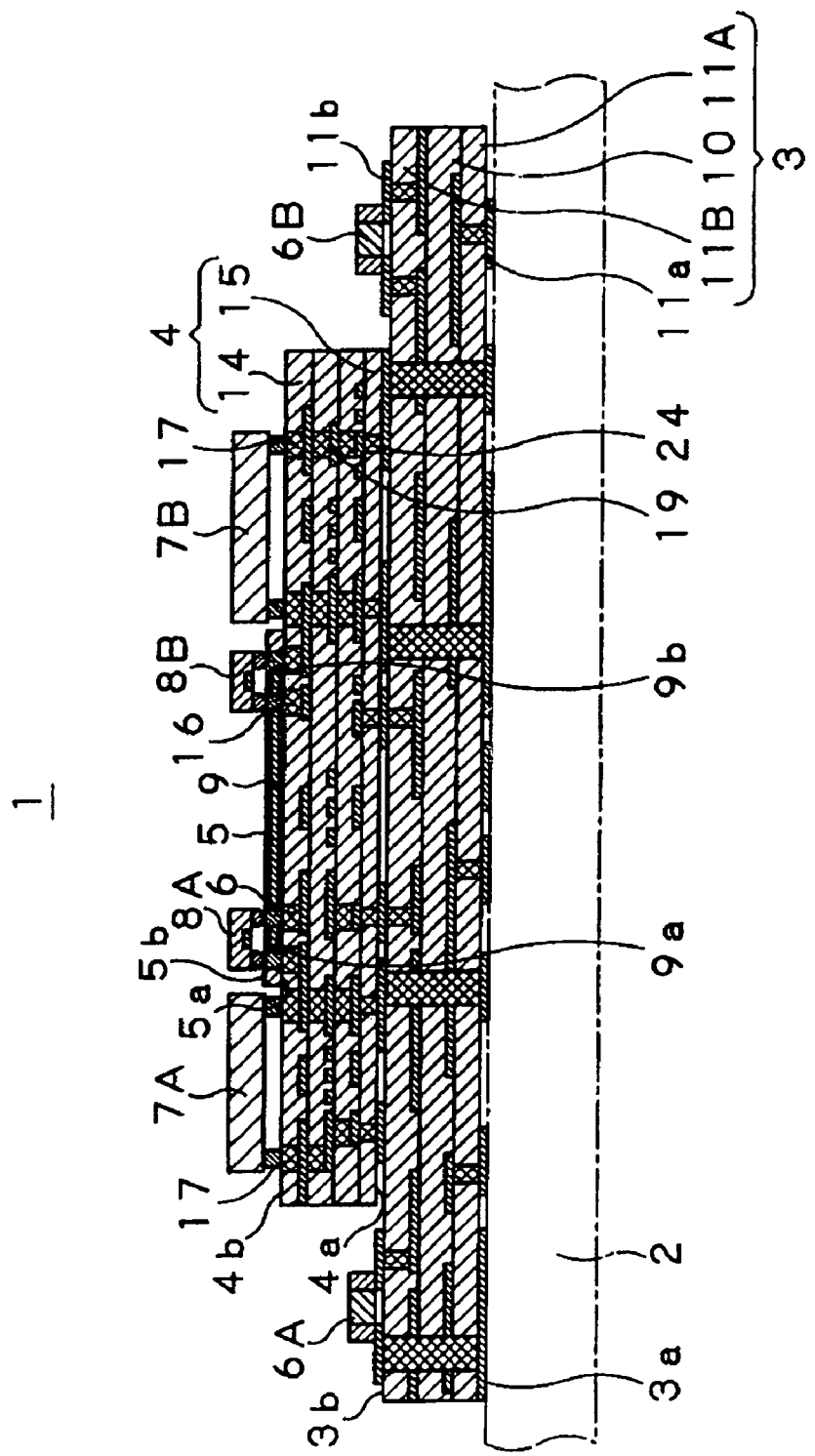
FIG. 1 is a schematic cross-sectional view of a hybrid circuit module with optical and electrical interconnects embedded, according to a preferred embodiment of the present invention.

As shown in FIG. 1, the circuit module 1 comprises a base substrate section 3 attached to an assembly board 2 such as an interposer and a motherboard with a first main surface 3a as a component side, a micro interconnect circuit section 4 mounted on a second main surface 3b of the base substrate section 3 with a first main surface 4a as a component side, and an optical interconnect circuit section 5 mounted on a second main surface 4b of the micro interconnect circuit section 4 with a first main surface 5a as a component side. The circuit module 1 is mounted with surface mount-type electronic components 6A, 6B (which will be hereinafter generally referred to as electronic components 6 for the convenience of a typical description thereof) on the second main surface 3b of the base substrate section 3.

The circuit module 1 is mounted with not only the optical interconnect circuit section 5 but also a sending-side semiconductor chip 7A and a receiving-side semiconductor chip 7B (which will be hereinafter generally referred to as semiconductor chips 7 for the convenience of a typical description thereof) for the information signal and the like on the second main surface 4b of the micro interconnect circuit section 4. In the circuit module 1, a light emitting device 8A and a photo detecting device 8B (which will be hereinafter generally referred to as optical elements 8 for the convenience of a typical description thereof) are also mounted on a second main surface 5b of the optical interconnect circuit section 5.

Alternatively, although not shown, the circuit module 1 may be also designed to mount the semiconductor chips 7 on the second main surface 3b of the base substrate section 3, with the electronic components 6 on the second main surface 4b of the micro interconnect circuit section 4, at need. Alternatively, the circuit module 1 may be also one mounted with the electronic components 6 and/or the semiconductor chips 7 respectively on the second main surface 5b of the optical interconnect circuit section 5. The circuit module 1 employs a semiconductor chip with pin reductions, as the semiconductor chips 7 mounted to the base substrate section 3.

The circuit module 1 is configured so that the micro interconnect circuit section 4 and the optical interconnect circuit section 5 are layer-to-layer connected electrically to the base substrate section 3 through via holes and connecting terminals respectively located therein, as will be described later in detail. In the circuit module 1, the electronic components 6, the semiconductor chips 7 and the optical elements 8 are also connected electrically together in a proper manner through the base substrate section 3, the micro interconnect circuit section 4 and the optical interconnect circuit section 5. In the circuit module 1, the light emitting device 8A and the photo detecting device 8B are connected optically together through an optical wave-guide 9 located in the optical interconnect circuit section 5, as will be described later in detail. Thus, optical transmission of the information signal and the like is attained between the sending-side semiconductor chip 7A and the receiving-side semiconductor chip 7B.

Figure 2:
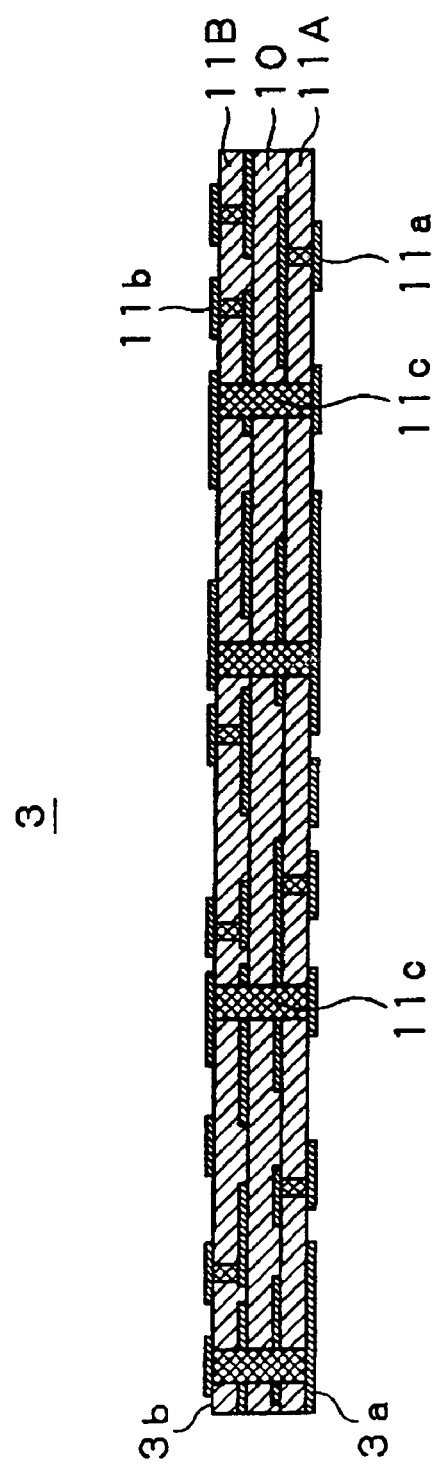
FIG. 2 is a schematic cross-sectional view of a base substrate section, according to a preferred embodiment of the present invention.

The circuit module 1 assigns the base substrate section 3 to a circuit section of a power system and a control system for the micro interconnect circuit section 4 and the optical interconnect circuit section 5. The base substrate section 3 comprises a multi layer interconnect substrate fabricated at relatively low cost using a conventionally prevailing printed circuit process. The base substrate section 3 is configured so that interconnect layers 11A and 11B of a single or multi layer structure respectively are deposited on the opposite sides of a main surface of an insulating substrate 10, as shown in FIG. 2, for instance. In the base substrate section 3, a suitable number of first connecting terminals 11a electrically connected to the assembly board 2 are bonded to the first main surface 3a-side first interconnect layer 11A, while a suitable number of second connecting terminals 11b adapted to mounting to the micro interconnect circuit section 4 in an electrically connected manner are bonded to the second main surface 3b-side second interconnect layer 11B. The base substrate section 3 also has a plurality of via holes 11c adapted to layer-to-layer connection between the first interconnect layer 11A and the second interconnect layer 11B in a proper manner.

The base substrate section 3 employs a ceramic substrate made of alumina, low-temperature sintered glass ceramics, aluminum nitride, mullite and the like, for instance, as the insulating substrate 10. Alternatively, the insulating substrate 10 may be also an organic insulating substrate obtained with glass epoxy, polyimide resin, bismaleito-triazine resin (BT-resin), polyphenyl-ethylene (PPE) resin, liquid crystal polymer, polynorbornane (PNB) resin, phenol resin, polyolefin resin, polytetrafluoro-ethylene resin and the like, for instance, as a base material.

In the base substrate section 3, the above insulating substrate is used as a core substrate to deposit the interconnect layers 11A and 11B on the opposite sides of the main surface of the above insulating substrate 10 through a process including coating of a dielectric resin layer with a photosensitive or non-photosensitive material such as epoxy resin, polyimide resin, benzocyclobutene (BCB), for instance, suitable patterning of the dielectric resin layer through photolithography and etching, and plating of the dielectric resin layer with copper and the like. It is noted that the base substrate section 3 is by no means limited to the above rigid substrate, and may be a flexible multi layer interconnect substrate employing a polyimide film, for instance.

The base substrate section 3 has the above first and second connecting terminals 11a and 11b that are bonded at given positions of the interconnect layers 11A and 11B through a process including bonding of copper bumps by electrolytic plating or electroless plating, and plating of the copper bumps with nickel-gold or solder. Although not shown, the base substrate section 3 may be also designed to entirely coat the first and second main surfaces 3a and 3b with a passivation layer in such a way as to expose the first and second connecting terminals 11a and 11b outwards.

It is noted that how to bond the first and second connecting terminals 11a and 11b is by no means limited to the above method, and other proper methods typically used in a printed circuit process is of course applicable to bond the above first and second connecting terminals. In addition, connecting terminals required for the micro interconnect circuit section 4 and the optical interconnect circuit section 5, as will be described later, may be also bonded using the above method.

Figure 3:
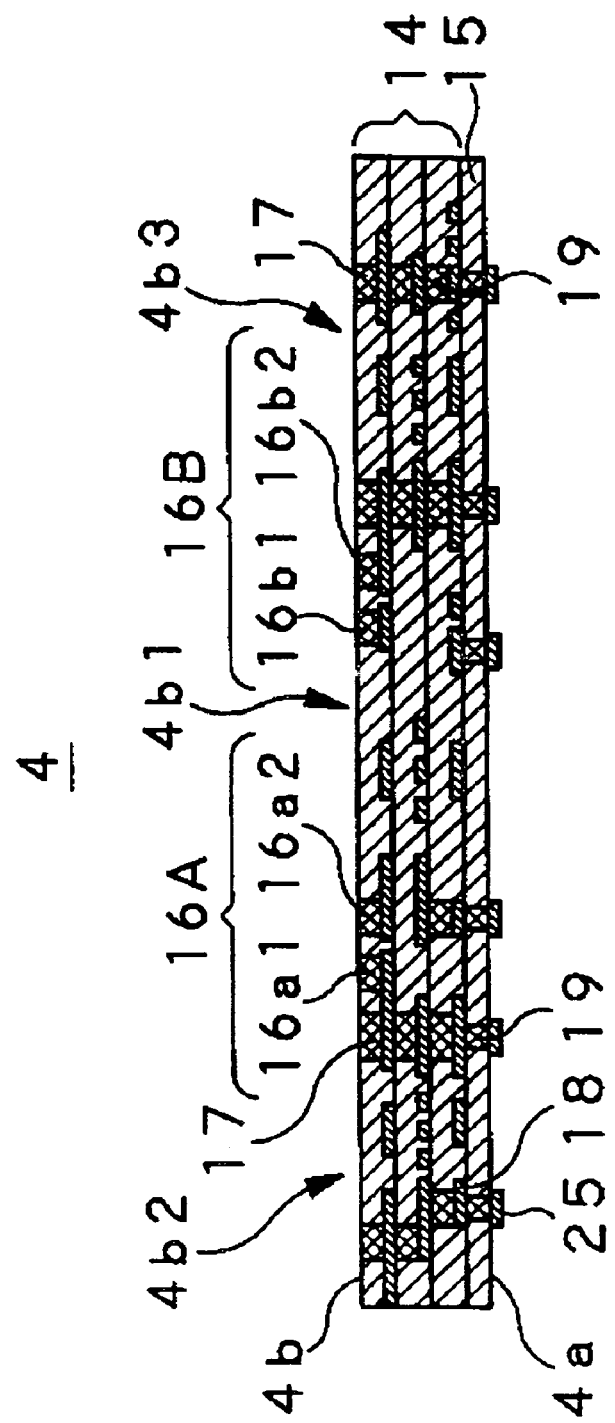
FIG. 3 is a schematic cross-sectional view of a micro interconnect circuit section, according to a preferred embodiment of the present invention.

The micro interconnect circuit section 4 needs a dummy substrate 12 having a release layer 13 on a main surface thereof, as will be described later in detail, and is fabricated on the dummy substrate 12 using the semiconductor process. The micro interconnect circuit section 4 has an accurate micro electrical interconnect layer 14 micro-fabricated using the semiconductor process with increased interconnect pattern density as high as about several μm, as compared with the above base substrate section 3 fabricated using the printed circuit process. As shown in FIG. 3, the micro interconnect circuit section 4 is composed of the micro electrical interconnect layer 14 of a multi layer structure and a bonding layer 15 whose surface serves as the first main surface 4a to form a component side for the base substrate section 3.

The micro interconnect circuit section 4 assigns a center area 4b1 of the second main surface 4b to a packaging area of the optical interconnect circuit section 5, and the opposite areas 4b2 and 4b3 of the center area 4b1 to packaging areas of the semiconductor chips 7, respectively. In the micro interconnect circuit section 4, a first connecting terminal 16 electrically connected to the optical interconnect circuit section 5, in other words, the optical elements 8, is located in the center area 4b1, while a plurality of second connecting terminals 17 electrically connected to the micro-fabricated semiconductor chips 7 with form-factor reductions or pin multiplication are located in the opposite areas 4b2 and 4b3. The first and second connecting terminals 16 and 17 are also subjected to the same terminal processing as that of the connecting terminals of the above base substrate section 3.

Specifically, the first connecting terminal 16 is composed of a light emitting device connecting terminal 16A having a pair of connecting terminals 16a1 and 16a2 adapted to connection of the light emitting device 8A and a photo detecting device connecting terminal 16B having a pair of connecting terminals 16b1 and 16b2 adapted to connection of the photo detecting device 8B. Although not shown in detail, the second connecting terminals 17 are composed of a large number of connecting terminals adapted to bare chip assembly of the semiconductor chips 7A and 7B respectively.

The micro interconnect circuit section 4 is mounted on the first main surface 3a by being bonded to the base substrate section 3 through the bonding layer 15. The micro interconnect circuit section 4 needs electrical connection to the base substrate section 3, so that the bonding layer 15 also has a plurality of connecting terminals 18 to correspond to the connecting terminals 11b of the base substrate section 3. Thus, the micro interconnect circuit section 4 is bare-assembled on the second main surface 3b of the base substrate section 3 through the bonding layer 15 in such a way as to allow the connecting terminals 18 to be electrically connected to the confronting connecting terminals 11b. The bonding layer 15 is formed with a thermosetting resin bonding material, for instance, and preferably needs to have properties of providing a semi-hardened state with heating temperature conditions, as will be described in the following processes of fabrication of the micro interconnect circuit section 4 and mounting of the micro interconnect circuit section 4 to the base substrate section 3. The bonding layer 15 is applied to one side of the main surface of the micro electrical interconnect layer 14 using an appropriate coating method, with being polished for contribution toward whole thickness reductions.

In the micro interconnect circuit section 4, the micro electrical interconnect layer 14 is adapted to connection between the first and second connecting terminals 16 and 17, and the second connecting terminals 17 are appropriately layer-to-layer connected to the connecting terminals 18 through the via holes 19. In addition, the micro interconnect circuit section 4 also has passive elements such as capacitor, resistor and inductor that are deposited in the micro electrical interconnect layer 14 using a thin film or thick film technology, for instance, although not shown in details. The capacitor is a de-coupling capacitor or a DC cutting capacitor, for instance, and is formed with a tantalum oxide (TaO) film or a tantalum nitride (TaN) film. The resistor is a resistor for termination resistance, for instance, and is formed with a TaN film. The micro interconnect section 4 applies the semiconductor process to deposit the micro electrical interconnect layer 14, so that deposition of an accurate passive elements in the micro electrical interconnect layer 14 is enabled. Thus, passive element functions having been satisfied with the chip components may be deposited in the micro electrical interconnect layer 14 to provide built-in small-sized high-performance passive elements with interconnection length reductions.

In the circuit module 1, the micro interconnect circuit section 4 having the micro electrical interconnect layer 14 whose interconnect density is as micro as about several μm is fabricated through a process which will be described later in detail. In addition, thus-fabricated micro interconnect circuit section 4 is mounted to the base substrate section 3. In general, an interconnect density accuracy attained with the printed circuit process is as much as about several ten μm, resulting in a difficulty in directly depositing the micro electrical interconnect layer 14 on the base substrate section 3. Thus, in the circuit module 1, the micro electrical interconnect layer 14 having been supposed to be difficult of fabrication with the printed circuit process is obtained by copying the separately fabricated micro interconnect circuit section 4 described later onto the base substrate section 3. Thus, in the circuit module 1, packaging accuracy of the electronic components 6 and the semiconductor chips 7 or the optical elements 8 is increased with increasing interconnect density.

Figure 4:
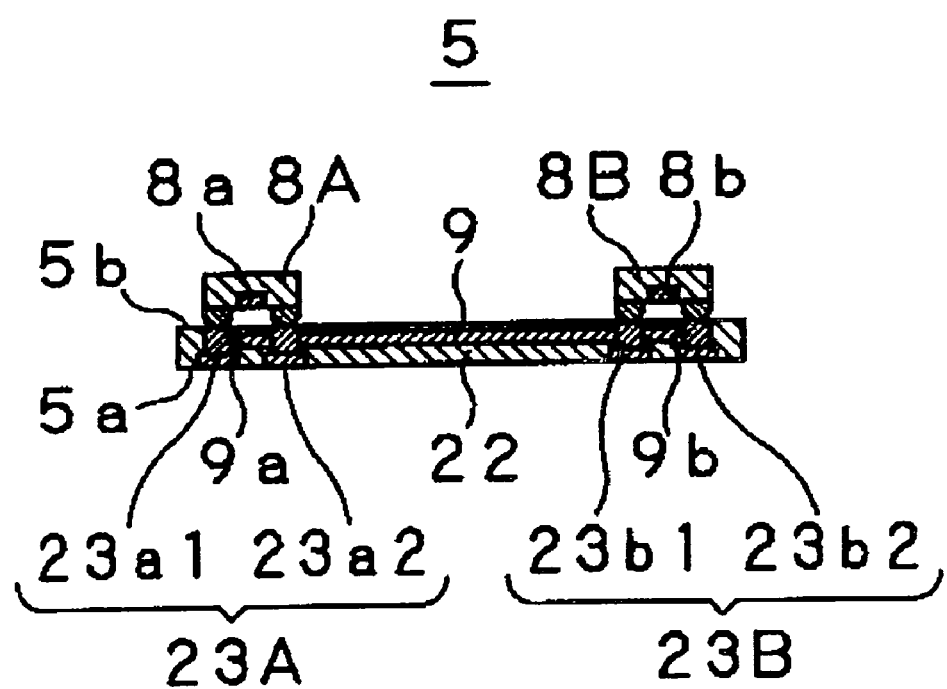
FIG. 4 is a schematic cross-sectional view of an optical interconnect circuit section, according to a preferred embodiment of the present invention.

The optical interconnect circuit section 5 also needs a dummy substrate 20 having a release layer 21 on a main surface thereof, as will be described later in detail, and is fabricated on the dummy substrate 21. The optical interconnect circuit section 5 has an optical wave-guide 9 in a cladding layer 22 in an optically sealed manner, as shown in FIG. 4. In the optical interconnect circuit section 5, flip chip bonding, for instance, is employed to mount the light emitting device 8A and the photo detecting device 8B on the second main surface 5b, with the light emitting device 8A electrically connected to a first connecting terminal 23A, and the photo detecting device 8B electrically connected to a second connecting terminal 23B.

The first and second connecting terminals 23A and 23B are designed to respectively extend through the first and second main surfaces 5a and 5b, while being electrically connected to the first connecting terminals 16 with the optical interconnect circuit section 5 mounted on the micro interconnect circuit section 4. The first connecting terminal 23A is connected to the semiconductor chip 7A through the micro interconnect circuit section 4, for instance, and supplies electrical information signal output from the semiconductor chip 7A to the light emitting device 8A. The second connecting terminal 23B is connected to the semiconductor chip 7B through the micro interconnect circuit section 4, for instance, and supplies electrical information signal output obtained through conversion by the photo detecting device 8B to the semiconductor chip 7B.

The optical interconnect circuit section 5 has a photo detecting section 9a at one end side of the optical wave-guide 9, and a light emitting section 9b at the other end side thereof. The photo detecting section 9a faces the light emitting section 8a of the light emitting device 8A, and the light emitting section 9B faces the photo detecting section 8b of the photo detecting device 8B. In the optical interconnect circuit section 5, the optical wave-guide 9 comprises a so-called light confinement-type optical wave-guide obtained by sealing a photoconductive core material, for instance, with a cladding material of different refractive index. The optical wave-guide 9 is formed with a photoconductive resin material such as polyimide resin, epoxy resin, acrylic resin, polyolefin resin and rubber resin, for instance. Alternatively, a mixture of these resins or a fluorine-containing polymer material is also available for a material of the optical wave-guide 9.

The optical wave-guide 9 ensures that the photo detecting section 9a configures a 45-degree mirror face that changes an optical path of emitted light from the light emitting device 8A by 90 degrees by cutting one end of the photo detecting section at an angle of 45 degrees. The optical wave-guide 9 also ensures that the light emitting section 9b configures a 45-degree mirror surface that changes an optical path of incident light accepted through the optical wave-guide by 90 degrees by cutting one end of the light emitting section at an angle of 45 degrees likewise.

In the thus-configured circuit module 1, the base substrate section 3 is attached to the motherboard and the like (not shown) with the first main surface 3a as the component side. With the circuit module 1, power supply with increased regulations takes place from the side of the base substrate section 3 having the power supply line and the ground with a sufficient area ensured toward the micro electrical interconnect layer 14 of the micro interconnect circuit section 4 and/or the optical elements 8 of the optical interconnect circuit section 5. The circuit module 1 ensures cost reductions as a whole, because of its advantages that not only the base substrate section 3 is fabricated at low cost, but also an accurate passive elements are deposited in the separately fabricated micro interconnect circuit section 4 with an accurate interconnect pattern.

The circuit module 1 ensures accurate mounting of the optical interconnect circuit section 5, with that of the highly integrated or pin-enhanced semiconductor chips 7, on the second main surface 4b of the micro interconnect circuit section 4. The circuit module 1 also ensures parasitic capacity reductions with reduced interconnection placement and routing, and hence, high speed transmission with increased capacity of the information signal, because of its advantages that not only a connection interval between the semiconductor chips 7 and the optical elements 8 is reduced, but also connection between the optical elements 8 is performed through the optical wave-guide 9.

Figure 5:
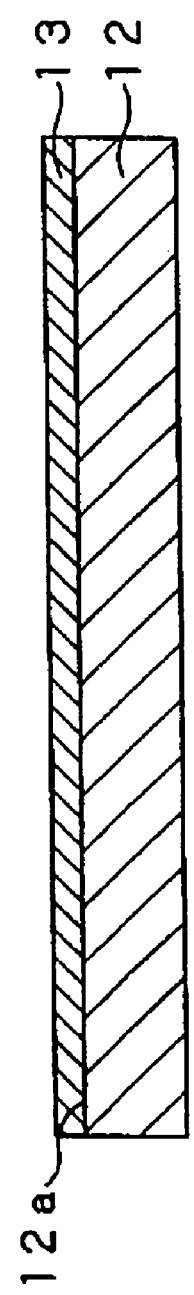
FIG. 5 is a schematic cross-sectional view of a dummy substrate having a release layer to be utilized in the manufacturing process of the micro interconnect circuit section, according to a preferred embodiment of the present invention.

In the circuit module 1, the micro interconnect circuit section 4 is fabricated separately from the base substrate section 3 using the semiconductor process as described above. In a process of fabrication of the micro interconnect circuit section 4, the dummy substrate 12 having the release layer 13 as shown in FIG. 5 is supplied, and the micro electrical interconnect layer 14 is deposited on the dummy substrate 12. The dummy substrate 12 employs an insulating, heat- or chemicals-resistant silicon substrate or glass substrate having the advantage of providing an accurate flat face.

The release layer 13 is deposited on a first main surface 12a of the dummy substrate 12, and has an effect of stripping the deposited micro interconnect circuit section 4 from the dummy substrate 12, as will be described later. The release layer 13 is formed with a material such as resins releasable with heating at temperatures equal to or more than a process temperature of the micro interconnect circuit section 4 and metals dissolvable with an acid or alkaline solution, and preferably needs to have a stripping action with a resistance to a deposition process of the micro electrical interconnect layer 14. The release layer 13 is obtained through a process including deposition of a thin metal layer of a uniform thickness with copper or aluminum on the first main surface 12a of the dummy substrate 12 by sputtering, for instance, and deposition of a polyimide resin layer and the like on the thin metal layer by spin coating, for instance.

Figure 6:
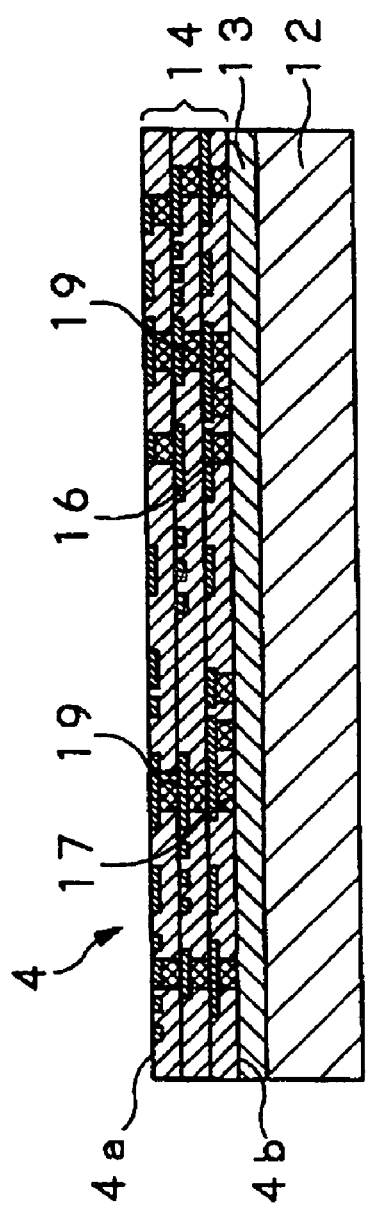
FIG. 6 is a schematic cross-sectional view having the micro interconnect circuit section formed on a dummy substrate, according to a preferred embodiment of the present invention.

The process of fabrication of the micro interconnect circuit section 4 is to provide the micro electrical interconnect layer 14 on the release layer 13, as shown in FIG. 6, by stacking an interconnect layer unit composed of an insulating resin layer and a micro interconnect layer, for instance, into a multi layer structure using the semiconductor process. The insulating resin layer is formed with an insulating dielectric material having low Tan δ characteristics with a low dielectric constant, in other words, high frequency characteristics and/or resistance to heat or chemicals, for instance, and benzocyclobutene, polyimide resin, polynorbornane, liquid crystal polymer, epoxy resin or acrylic resin is available. The insulating resin layer is deposited using an appropriate deposition method such as spin coating.

A micro interconnect pattern configuring each interconnect layer unit is formed on the insulating resin layer. When the insulating resin layer formed with a photosensitive insulating dielectric material, for instance, is deposited, the micro interconnect pattern is directly formed on the insulating resin layer using photolithography. Alternatively, when the insulating resin layer formed with a non-photosensitive insulating dielectric material is deposited, a combination of photolithography with dry etching is employed to form the micro interconnect pattern on the insulating resin layer. The process of fabrication of the micro interconnect circuit section 4 involves deposition of a metal film by plating in the micro interconnect pattern on the insulating resin layer. The above plating is to apply copper plating, for instance, with the release layer as a voltage application electrode, for instance, and ensures that a pattern opening is deposited with a copper-plated layer of a regulated thickness as substantially equal as that of the insulating resin layer.

The process of fabrication of the micro interconnect circuit section 4 is also to provide successively upper interconnect layer units through a process including deposition, patterning and metal plating and the like of the insulating resin layer after the first interconnect layer unit is deposited through the above process. In the process of fabrication of the micro interconnect circuit section 4, boring of the via holes 19 also takes place simultaneously with patterning. The boring of the via holes 19 is performed using photolithography in such a way as to allow a predetermined position of a lower-side micro interconnect layer for the insulating resin layer to face outwards, or with laser irradiation, for instance.

In the process of fabrication of the micro interconnect circuit section 4, thin film passive elements such as thin film resistor, capacitor and inductor are deposited in a section of each of the above interconnect layer units. The thin film resistor is obtained by patterning a resistor material such as nickel-chromium, titanium nitride and tantalum nitride between the interconnect patterns using an appropriate method such as photolithography, sputtering and vapor deposition. Alternatively, the thin film resistor may be one obtained through a process including deposition of tantalum nitride on the insulating resin layer using a lift-off method, sputtering of the tantalum nitride over the whole surface after resist processing applied on a tantalum nitride layer and etching of the tantalum nitride from a resist layer.

Deposition of the thin film capacitor takes place through a process including coating of a resist layer on the whole surface of the lower interconnect layer unit after patterning of an expected capacitor portion, anode oxidation of providing a tantalum oxide layer by application of an electric field so as to allow the tantalum oxide to act as an anode in an ammonium borate electrolyte and the like and deposition of an upper electrode. In the deposition of the thin film capacitor, an upper electrode consisting of nickel and copper is deposited using a lift-off method, for instance, by subjecting the tantalum oxide layer to masking, with photolithography so as to remain only a required interconnect pattern.

The process of fabrication of the micro interconnect circuit section 4 is also to provide a spiral inductor, for instance, in a section of the interconnect layer unit. The inductor is deposited as a thick film pattern on the insulating resin layer by sputtering with a nickel-copper sputter layer electroplated, resulting in suppression of loss worsening In the process of fabrication of the micro interconnect circuit section 4, the micro electrical interconnect layer 14 composed of a large number of interconnect layer units with a second main surface 4b-side layer as a first layer for the dummy substrate 12 is deposited. In the process of fabrication of the micro interconnect circuit section 4, the first connecting terminals 16 adapted to connection to the above optical interconnect circuit section 5 and the first connecting terminals 17 adapted to mounting packaging of the semiconductor chips 7 are bonded to the first interconnect layer unit. In the process of fabrication of the micro interconnect circuit section 4, the connecting terminals 18 are appropriately bonded to the interconnect layer unit that forms the first main surface 4a as the uppermost layer on the dummy substrate 12. The connecting terminals 18 are subjected to terminal processing required for attaining electrical connection to the base substrate section 3.

Figure 7:
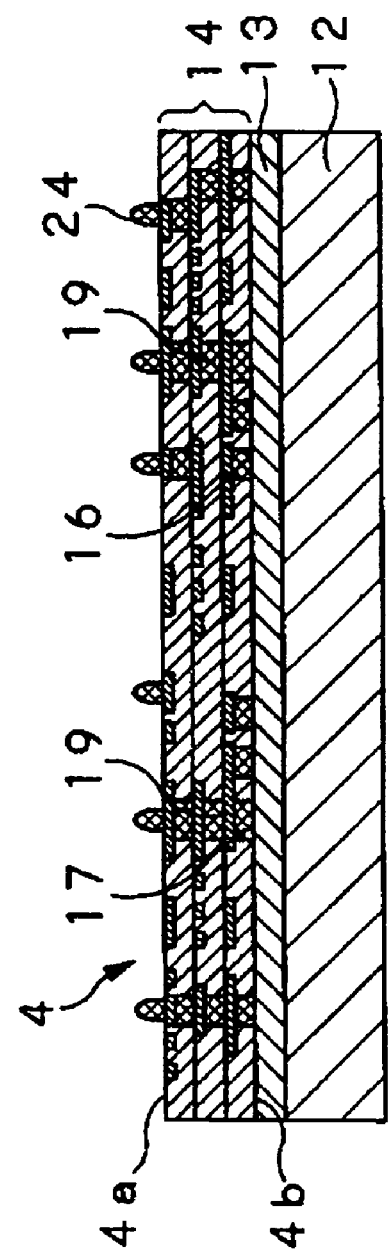
FIG. 7 is a schematic cross-sectional view having a connecting bump formed in the micro interconnect circuit section, according to a preferred embodiment of the present invention.

In bonding of the connecting terminals 18, connection bumps 24 in a copper post form are bonded to given positions of the uppermost interconnect layer unit by electroplating with copper using an additive method, for instance, as shown in FIG. 7. The boding of the connecting terminals 18 may be of course to provide the connection bumps 24 by bonding solder bumps to given positions of the interconnect layer unit, for instance.

Alternatively, the process of fabrication of the micro interconnect circuit section 4 may be also to provide the micro electrical interconnect layer 14 through polishing of a metal layer wholly deposited on an insulating layer after trenches corresponding to the interconnect pattern are formed on the insulating layer, for instance. Alternatively, the process of fabrication of the micro interconnect circuit section 4 may be also to provide the interconnect pattern and the via holes 19 through a process including two-stage exposure, plating and chemical-mechanical polishing (CMP) and the like, for instance.

Figure 8:
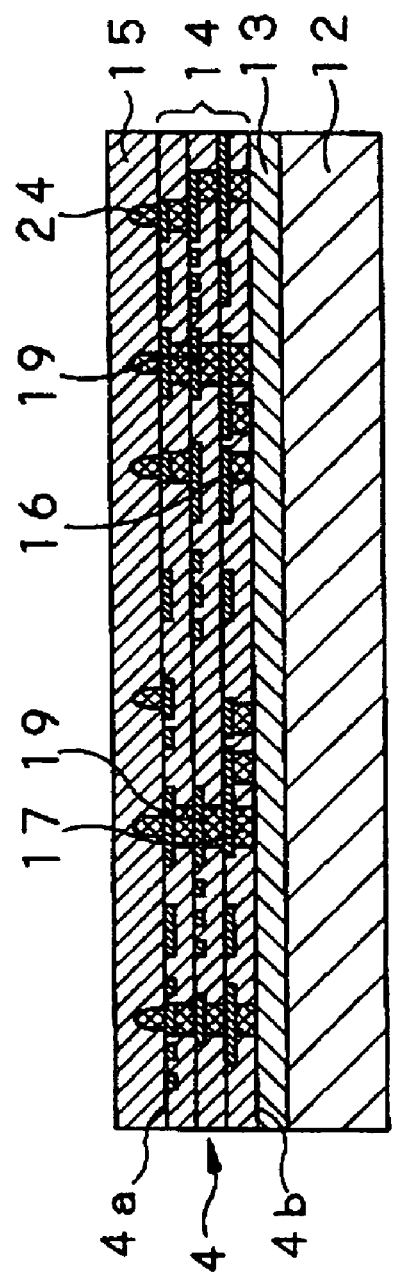
FIG. 8 is a schematic cross-sectional view having a bonding layer, according to a preferred embodiment of the present invention.

In the process of fabrication of the micro interconnect circuit section 4, the bonding layer 15 is deposited over the whole surface of the first main surface 4a of the micro interconnect circuit section 4 so as to cover the connection bumps 24, as shown in FIG. 8. The bonding layer 15 is formed with a thermosetting resin bonding material, for instance, which is applied on the first main surface 4a using an appropriate coating method. The bonding layer 15 is subjected to planarization by polishing, as will be described later, and therefore, preferably needs to have properties of changing a state from semi-hardened to hardened with heating temperature conditions. The bonding layer 15 is changed to the semi-hardened state to hold the connection bumps 24 in position by being heated up to a given temperature.

Figure 9:
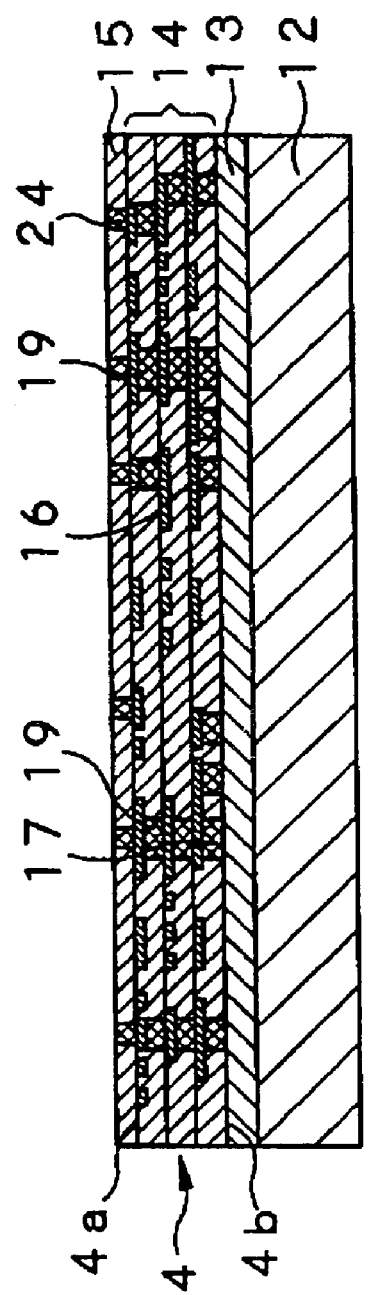
FIG. 9 is a schematic cross-sectional view having the bonding layer after polishing process, according to a preferred embodiment of the present invention.
Figure 10:
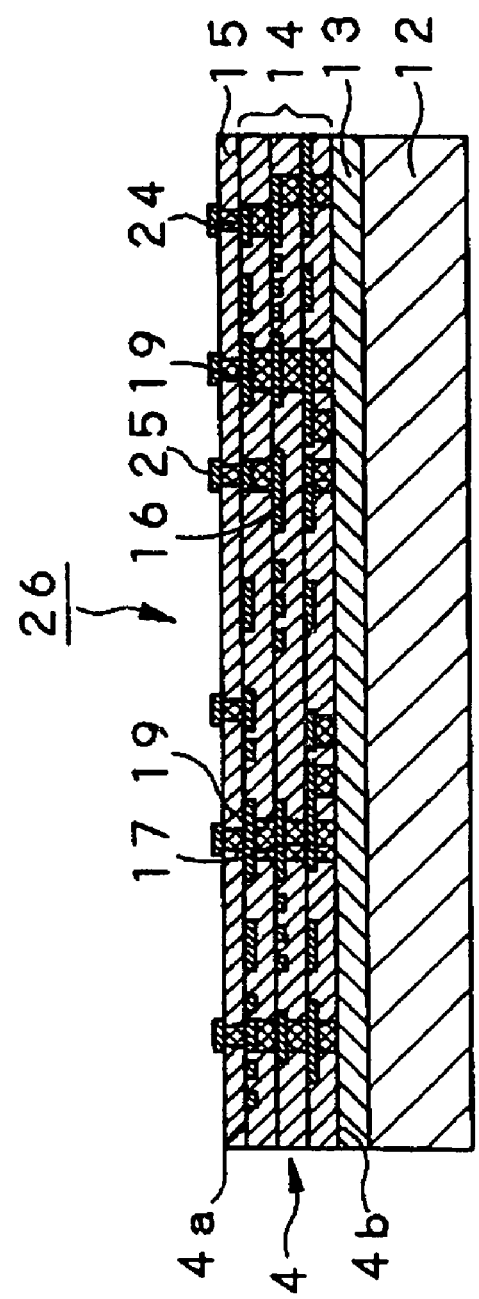
FIG. 10 is a schematic cross-sectional view having solder bumps bonded, according to a preferred embodiment of the present invention.

The bonding layer 15 is polished into a flat surface with the connection bumps 24 exposed to a surface of the bonding layer as shown in FIG. 9. As the polishing, chemical-mechanical polishing is preferably employed, because of a need for polishing of the metal and the resin. The bonding layer 15 is in a semi-hardened state and thus, may provide a more accurate flat surface efficiently. The bonding layer 15 maintains the semi-hardened state in the form of the flat surface, and is thus effective in being accurately bonded to the base substrate section 3 whose flatness is slightly degraded, with copying properties exerted. In the process of fabrication of the micro interconnect circuit section 4, solder bumps 25 are respectively bonded to the exposed connection bumps 24 through solder resist and the like, thereby providing a first intermediate structure 26 as shown in FIG. 10. When the connection bumps 24 employing the solder bumps are in use, the micro interconnect circuit section 4 of course requires no bonding of the solder bumps 25 to the connection bumps 24.

Figure 11:
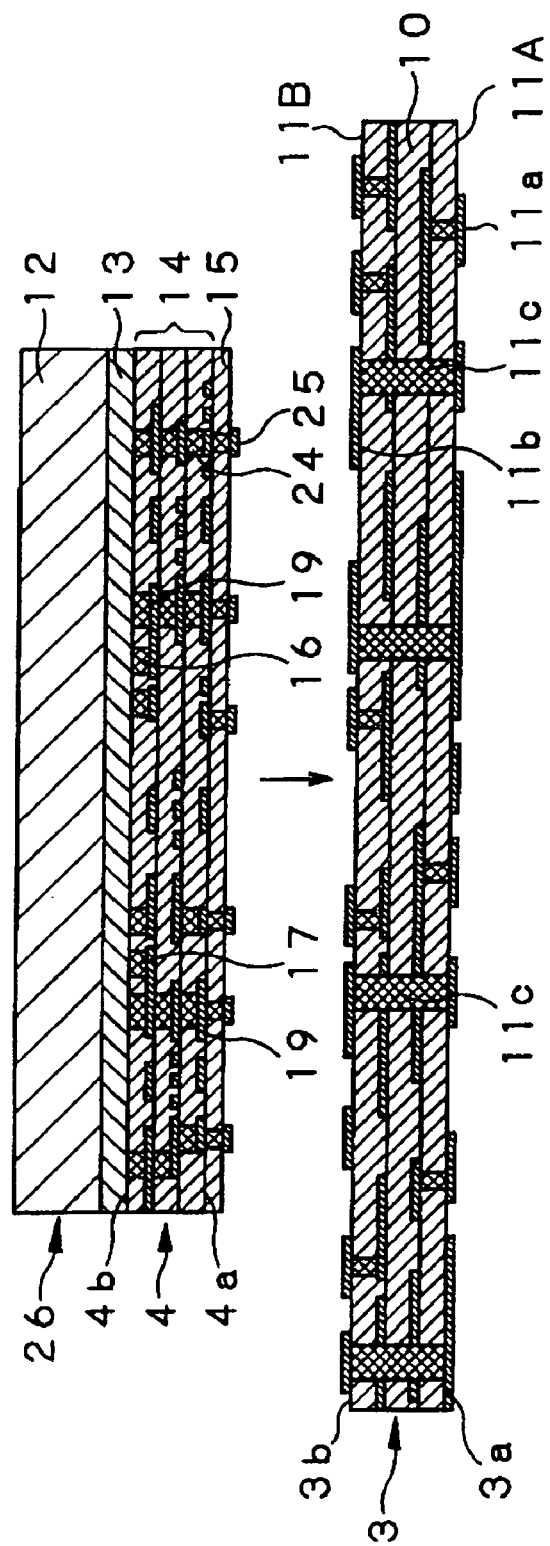
FIG. 11 is a schematic cross-sectional view for describing the process of mounting on the base substrate section, an intermediate structure having the micro interconnect circuit section formed on the dummy substrate, according to a preferred embodiment of the present invention.
Figure 12:
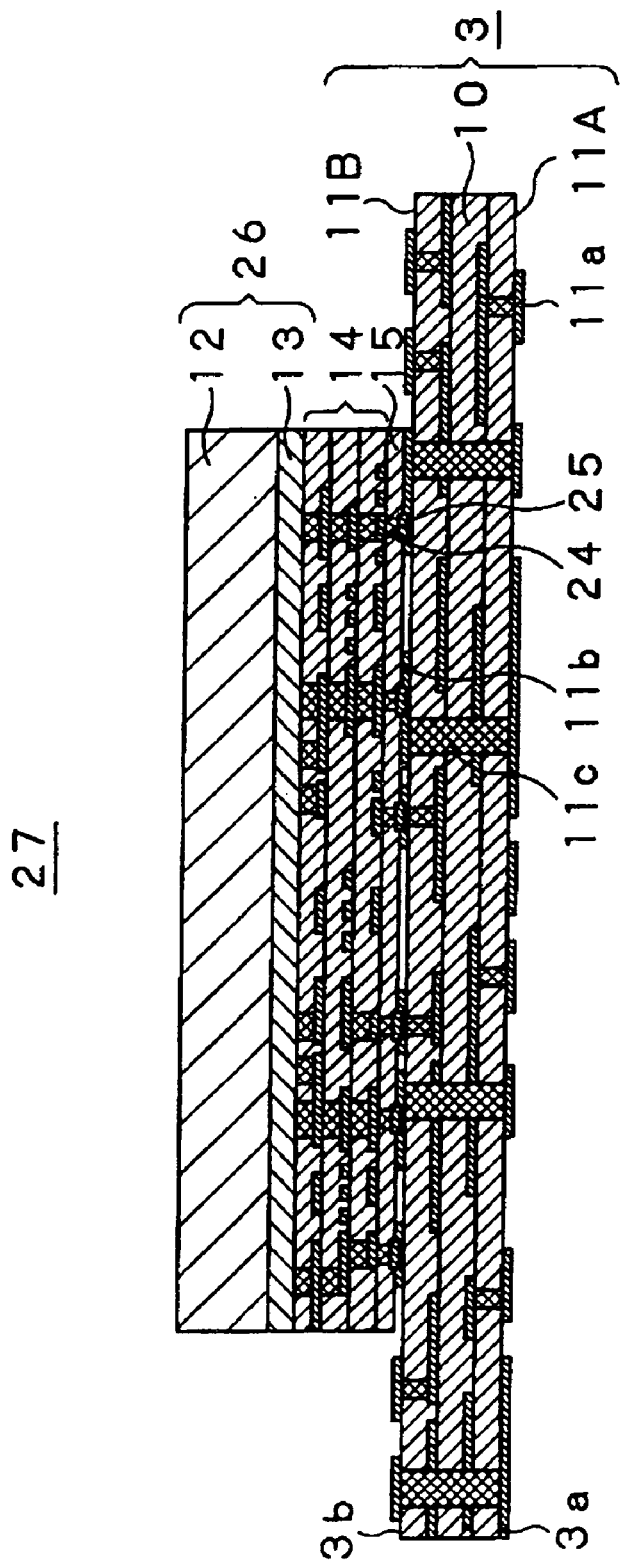
FIG. 12 is a schematic cross-sectional view of a second intermediate structure having the intermediate structure mounted on the base substrate section, according to a preferred embodiment of the present invention.

In the process of fabrication of the micro interconnect circuit section 4, the first intermediate structure 26 is mounted on the second main surface 3b of the base substrate section 3 with the uppermost bonding layer 15 as a component side by facing down the first intermediate structure 26 as shown by an arrow in FIG. 11. In the process of fabrication of the micro interconnect circuit section 4, in this case, the connection bumps 24, in other words, the connecting terminals 18 are aligned with the confronting second connecting terminals 11b at the second main surface 3b-side of the base substrate section 3, before being bonded thereto. In the process of fabrication of the micro interconnect circuit section 4, the first intermediate structure 26 is firmly bonded and fixed to the base substrate section 3 by subjecting the base substrate section 3 combined with the first intermediate structure 26 to re-flow soldering, for instance, thereby providing a second intermediate structure 27. In the process of fabrication of the micro interconnect circuit section 4, in this case, heating under temperature conditions that allow the connection bumps 24 to be melted takes place after completion of heating under temperature conditions that allow the bonding layer 15 to be hardened.

Figure 13:
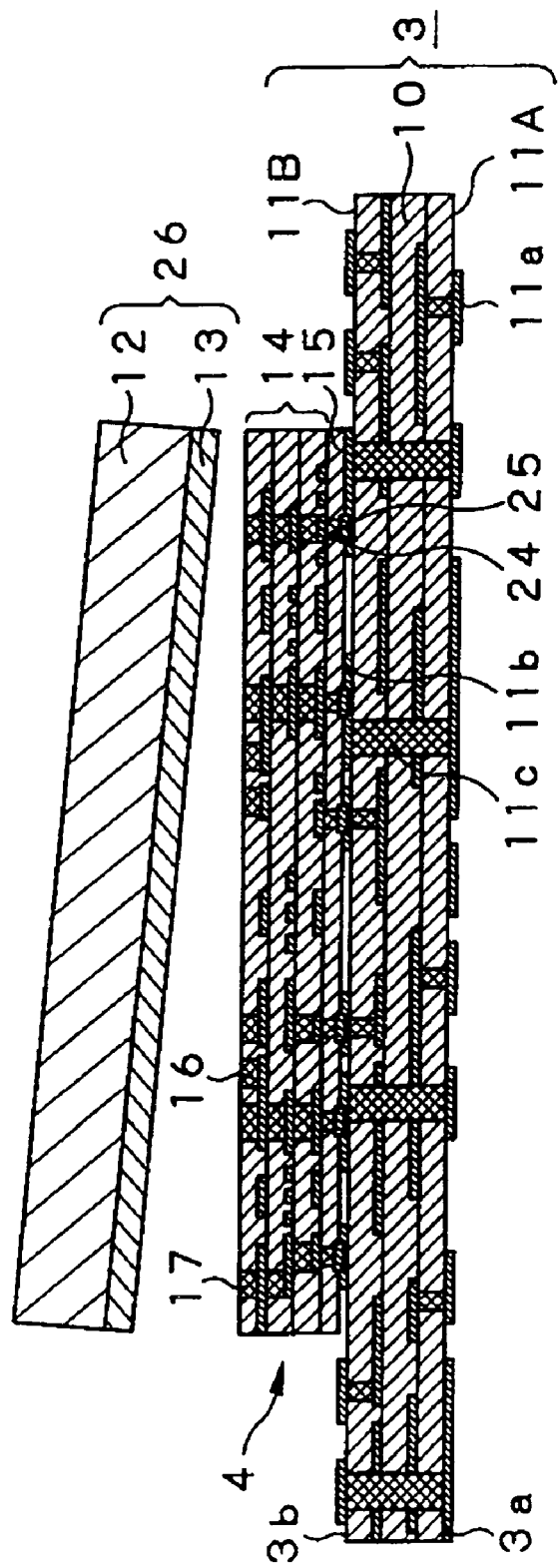
FIG. 13 is a schematic cross-sectional view for describing the process of releasing the dummy substrate from the micro interconnect circuit section.

In the process of fabrication of the micro interconnect circuit section 4, the second intermediate structure 27 is cooled down in a predetermined manner, before stripping of the dummy substrate 12 through the release layer 13 takes place so as to level the micro interconnect circuit section 4 on the base substrate section 3 as shown in FIG. 13. In the process of fabrication of the micro interconnect circuit section 4, the dummy substrate 12 is stripped by heating at temperatures equal to or more than a temperature at which the resin material of the release layer 13 becomes releasable, or immersion in an acid or alkaline solution.

In the process of fabrication of the micro interconnect circuit section 4, when the release layer 13 composed of a resin layer and a copper layer is used, for instance, immersion of the second intermediate structure 27 into a nitric acid solution allows the copper layer to be slightly dissolved, resulting in separation of the micro interconnect circuit section 4 from the dummy substrate 12 through the release layer 13 as shown by an arrow of FIG. 13. The micro interconnect circuit section 4 has a possibility that an interconnect pattern surface of the micro electrical interconnect layer 14 is also dissolved when being immersed into the nitric acid solution, so that it is allowable to deposit a passivation layer between the micro electrical interconnect layer 14 and the release layer 13.

In the process of fabrication of the micro interconnect circuit section 4, the micro interconnect circuit section 4 is mounted on the base substrate section 3 as it is being on the dummy substrate 12, so that accurate positioning of the micro interconnect circuit section 4 even with a small thickness is ensured before mounting, with simplification of the mounting process, similarly to mounting of typical packaged components.

Figure 14:
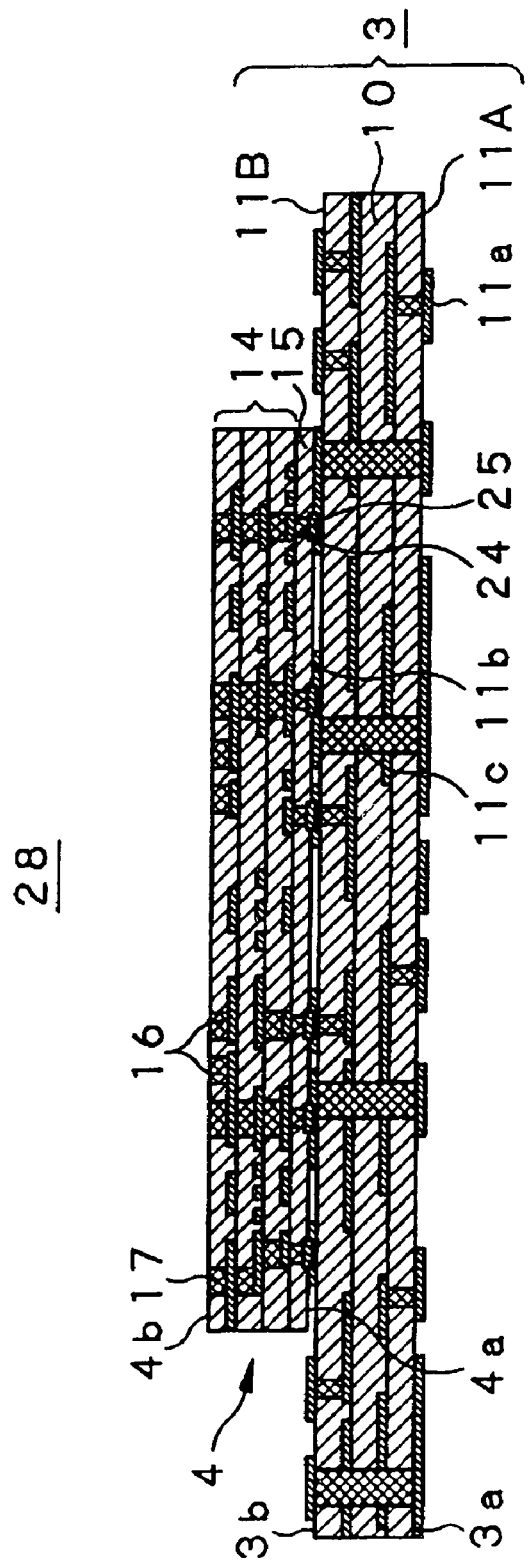
FIG. 14 is a schematic cross-sectional view of a third intermediate structure having the micro interconnect circuit section mounted on the base substrate section, according to a preferred embodiment of the present invention.

In the process of fabrication of the circuit module 1, the micro interconnect circuit section 4 fabricated on the dummy substrate 12 using the semiconductor process is mounted on the base substrate section 3 fabricated through the above process using the printed circuit process, thereby providing a third intermediate structure 28 as shown in FIG. 14. In addition, the optical interconnect circuit section 5 is mounted on the micro interconnect circuit section 4 of the third intermediate structure 28 through a mounting process, as will be described later in detail, thereby providing the circuit module 1. In the process of fabrication of the circuit module 1, the electronic components 6 may be also held in position to the second main surface 3b of the base substrate section 3, before being mounted thereon by re-flow soldering simultaneously with re-flow soldering that takes place with the optical interconnect circuit section 5 held in position to the base substrate section 3.

Specifically, in the above process of fabrication of the micro interconnect circuit section 4, the micro interconnect circuit section 4 is bonded to the base substrate section 3 by heating with the micro interconnect circuit section 4 held in position to the dummy substrate 12, before being stripped from the dummy substrate 12, as will be described later in detail. Thus, the process of fabrication of the micro interconnect circuit section 4 needs to deposit the micro electrical interconnect layer 14 of a multi layer structure with the second main surface 4b-side layer as the first layer for the dummy substrate 12. Alternatively, when the micro interconnect circuit section 4 is stripped from the dummy substrate 12 before being bonded to the base substrate section 3, the process of fabrication of the micro interconnect circuit section 4 may be to deposit the micro electrical interconnect layer 14 with the first main surface 4a-side layer as the first layer.

In the process of fabrication of the circuit module 1, it is noted that bonding of the base substrate section 3 to the micro interconnect circuit section 4 is by no means limited to the above structure and the above process. In the process of fabrication of the circuit module 1, a typical surface mount structure realized using flip-chip bonding and the like, for instance, may be also applied to mount the micro interconnect circuit section 4 on the base substrate section 3 without use of the bonding layer 15 and/or the connection bumps 24.

In the process of fabrication of the circuit module 1, the separately fabricated optical interconnect circuit section 5 is mounted on the micro interconnect circuit section 4 of the above third intermediate structure 28. In the process of fabrication of the circuit module 1, it is also allowable to mount the semiconductor chips 7 on the micro interconnect circuit section 4 simultaneously with mounting of the optical interconnect circuit section 5 thereon, as will be described later.

Figure 15:
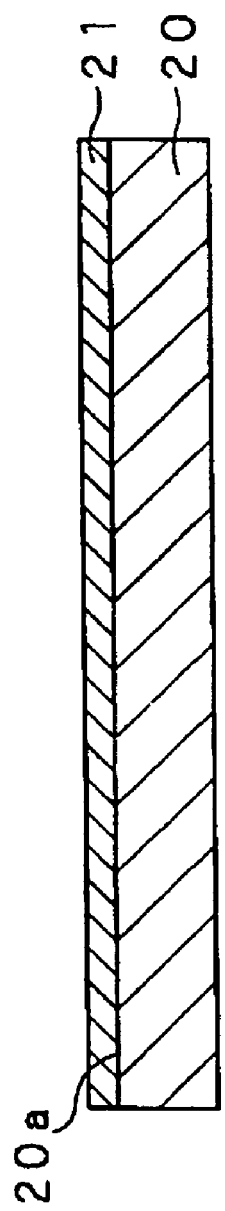
FIG. 15 is a schematic cross-sectional view of a dummy substrate having a release layer to be utilized in the manufacturing process of the optical interconnect circuit section, according to a preferred embodiment of the present invention.

In the process of fabrication of the optical interconnect circuit section 5, the dummy substrate 20 is also used similarly to the above micro interconnect circuit section 4. The dummy substrate 20 employs also an insulating, heat- or chemicals-resistant silicon substrate or glass substrate having the advantage of providing an accurate flat surface. As shown in FIG. 15, the dummy substrate 20 has a release layer 21 on a first main surface 20a thereof, and the optical interconnect circuit section 5 fabricated through a process as will be described later is stripped from the dummy substrate 20 through the release layer 21. The release layer 21 is also formed with a material such as resins releasable with heating at temperatures equal to or more than a process temperature and metals dissolvable with an acid or alkaline solution, and preferably needs to have a stripping action with a resistance to the deposition process of the optical interconnect circuit section 5. The release layer 21 is obtained through a process including deposition of a thin metal layer of a uniform thickness with copper and aluminum on the first main surface 20a of the dummy substrate 20 by sputtering, for instance, and deposition of a polyimide resin layer and the like on the thin metal layer by spin coating, for instance.

The process of fabrication of the optical interconnect circuit section 5 is to provide the optical interconnect circuit section 5 on the dummy substrate 20, with a so-called light confinement-type optical wave-guide obtained by coating an outer circumference of a photoconductive core material with a cladding material of low refractive index. In the process of fabrication of the optical interconnect circuit section 5, the optical interconnect circuit section 5 with a second main surface 5b-side layer as a first layer for the dummy substrate 20 is deposited. In the process of fabrication of the optical interconnect circuit section 5, the optical wave-guide 9 is formed with the photoconductive resin material such as polyimide resin, epoxy resin, acrylic resin, polyolefin resin, rubber resin, the mixture of these resins and the fluorine-containing polymer material, as described above. In the process of fabrication of the optical interconnect circuit section 5, a material obtained by being hardened from liquefied or a film-shaped material is available for the above core material or cladding material.

Figure 16:
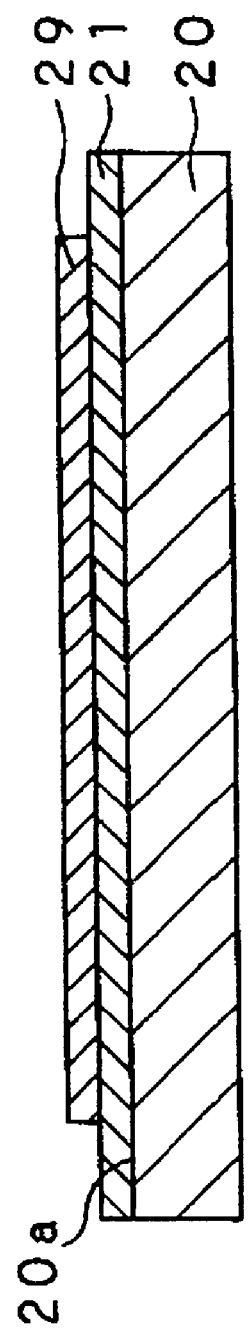
FIG. 16 is a schematic cross-sectional view having a lower clad layer, according to a preferred embodiment of the present invention.
Figure 17:
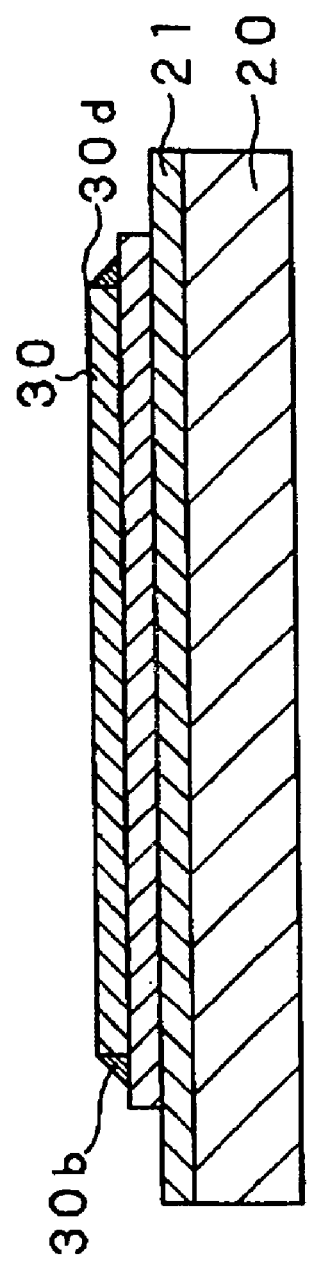
FIG. 17 is a schematic cross-sectional view having a core layer, according to a preferred embodiment of the present invention.

In the process of fabrication of the optical interconnect circuit section 5, a lower cladding layer 29 is deposited with the cladding material on the main surface of the release layer 21, as shown in FIG. 16. Specifically, the lower cladding layer 29 is located at an upper side in a packaged state, on the ground that the optical interconnect circuit section 5 is mounted in a faced-down manner on the third intermediate structure 28 as it is being on the dummy substrate 20, as will be described later. In the process of fabrication of the optical interconnect circuit section 5, a core layer 30 is deposited with the core material on the lower cladding layer 29, as shown in FIG. 17. Specifically, when the optical wave-guide 9 is of a three-dimensional light confinement type, the core layer 30 is obtained by filling the core material in a trench that is patterned on the lower cladding layer 29 into the optical wave-guide. Alternatively, when the optical wave-guide 9 is of a slab light confinement type, the core layer 30 is obtained by bonding a sheet-shaped core material to the lower cladding layer 29.

In the process of fabrication of the optical interconnect circuit section 5, the opposite ends of the core layer 30 in a longitudinal direction are subjected to cutting to provide a first mirror face 30a configuring the photo detecting section 9a and a second mirror face 30b configuring the light emitting section 9b. The first and second mirror faces 30a and 30b are effective in changing an optical path of light transmitted through the optical wave-guide 9 by 90 degrees by cutting each of the opposite ends at an angle of 45 degrees. The first and second mirror faces 30a and 30b are respectively formed at an inclination of 45 degrees that provides the core layer 30 having a larger bottom face than an upper face, on the ground that the optical interconnect circuit section 5 is mounted in the faced-down manner on the micro interconnect circuit section 4 as described above. Alternatively, the first and second mirror faces 30a and 30b may be inclined in an opposite direction, when the optical interconnect circuit section 5 is stripped from the dummy substrate 20 before being mounted on the micro interconnect circuit section 4 without being faced down.

Figure 18:
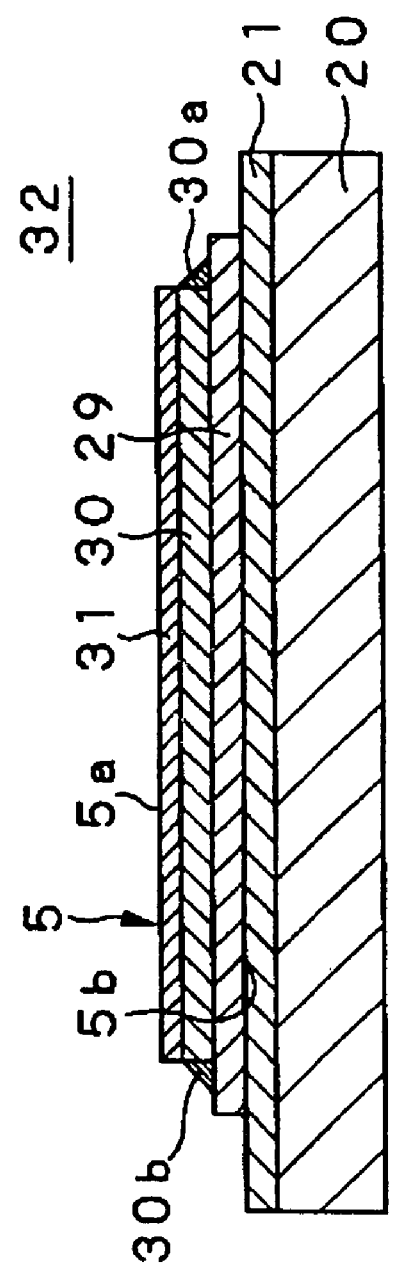
FIG. 18 is a schematic cross-sectional view having an upper clad layer, according to a preferred embodiment of the present invention.

In the optical interconnect circuit section 5, when an upper cladding layer 31 is deposited on the core layer 30 except for the first and second mirror faces 30a and 30b, the first and second mirror faces 30a and 30b configure total reflection mirror faces, as shown in FIG. 18. Alternatively, when the upper cladding layer 31 is deposited on the core layer 30 inclusively of the first and second mirror faces 30a and 30b, the mirror faces are formed with gold or aluminum thin films coated on the surfaces of the first and second mirror faces 30a and 30b.

Specifically, in the process of fabrication of the optical interconnect circuit section 5, when the above first and second mirror faces 30a and 30b are provided for the core layer 30 formed with the above photosensitive material, a photo mask pattern used for patterning with the lower cladding layer 29 subjected to photolithography is obtained using a gray scale. Alternatively, in the process of fabrication of the optical interconnect circuit section 5, when the core layer 30 is patterned with dry etching, for instance, the above first and second mirror faces 30a and 30b may be formed by so-called tapered etching. In the process of fabrication of the optical interconnect circuit section 5, a fourth intermediate structure 32 with the optical interconnect circuit section 5 on the dummy substrate 20 as shown in FIG. 18 is fabricated through the above process.

Specifically, in the above description on the process of fabrication of the optical interconnect circuit section 5, deposition of the optical wave-guide 9 of a single-layer structure on the dummy substrate 20 is only given. Alternatively, the optical wave-guide 9 may be course designed to extend over a plurality of layers. In this case, although not shown in detail, the optical interconnect circuit section 5 is configured, for instance, so that a lower layer-side optical wave-guide 9 is formed longer than an upper layer-side optical wave-guide 9, with the opposite ends projecting from the opposite ends of the upper-layer side optical wave-guide in such a way as to extend toward the upper face (the first main surface 5a) through the 45-degree mirror face.

In the above description on the process of fabrication of the optical interconnect circuit section 5, deposition of the optical wave-guide 9 is only given. However, the optical interconnect circuit section 5 also needs to have the connecting terminals 23, to which the optical elements 8 are electrically connected. In the optical interconnect circuit section 5, the via holes extending through the first and second main surfaces 5a and 5b are bored by typical via boring, and the plurality of connecting terminals 23 are thus provided to electrically layer-to-layer connect between the first and second main surfaces 5a and 5b through the via holes. The optical interconnect circuit section 5 is mounted with the optical elements 8 on the second main surface 5b obtained after the dummy substrate 20 is stripped through a process, as will be described later.

Specifically, although not shown in detail, in the optical interconnect circuit section 5, the connecting terminals 23 are subjected to terminal processing on the first and second main surfaces 5a and 5b. Alternatively, the optical interconnect circuit section 5 may be also designed to coat a passivation layer on the first and second main surfaces 5a and 5b at need, except for the connecting terminals 23. The processes such as terminal processing and coating of the passivation layer on the first main surface 5a-side take place with the optical interconnect circuit section 5 held to the dummy substrate 20. On the other hand, the above processes on the second main surface 5b-side take place after completion of stripping of the optical interconnect circuit section 5 from the dummy substrate 20. Alternatively, the optical interconnect circuit section 5 may be also designed to have an appropriate electrical interconnect pattern at need. In this case, the optical interconnect circuit section 5 may provide an accurate electrical interconnect pattern on the dummy substrate 20.

Figure 19:
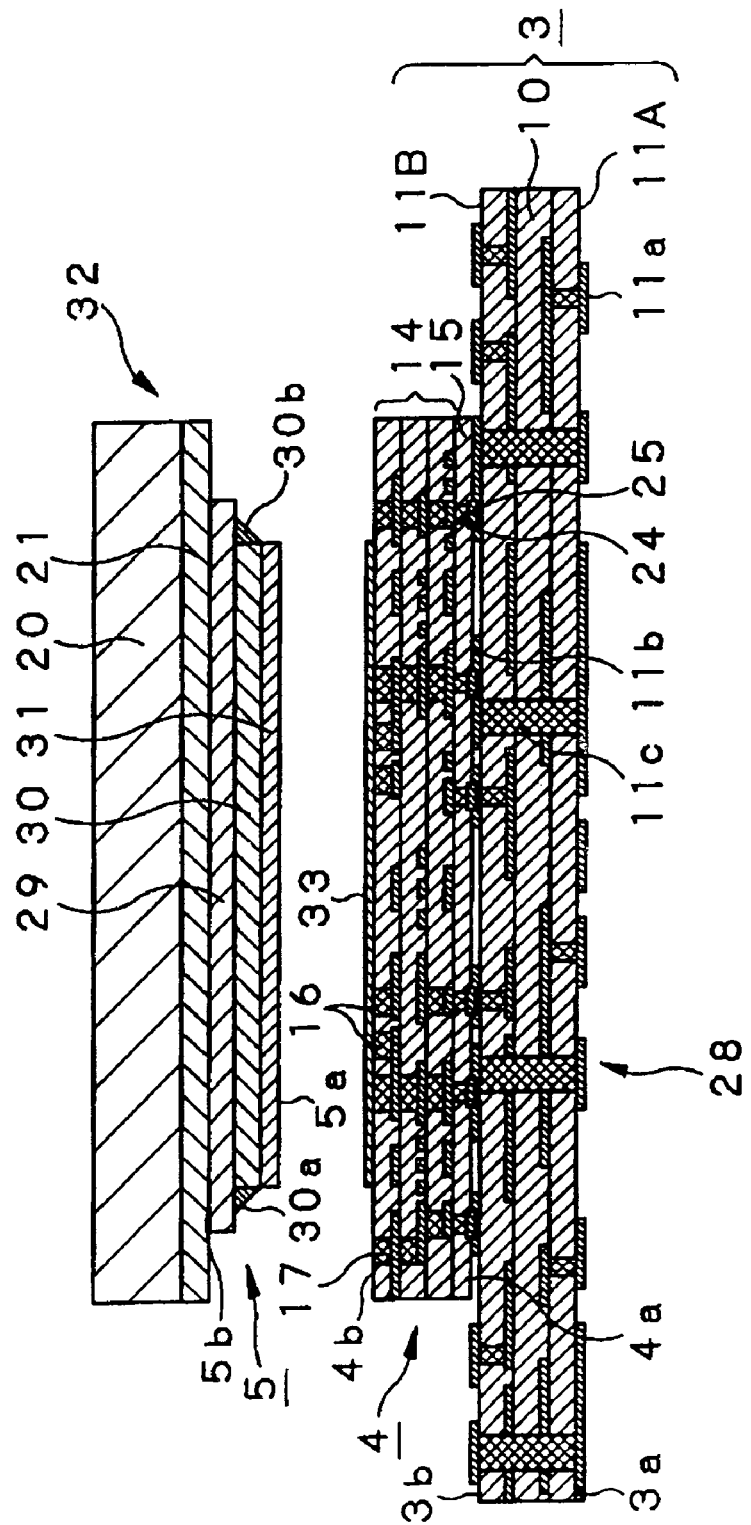
FIG. 19 is a schematic cross-sectional view for describing the process of mounting, on the third intermediate structure, a fourth intermediate structure having the optical interconnect circuit section formed on the dummy substrate on the base substrate section, according to a preferred embodiment of the present invention.

In the process of fabrication of the circuit module 1, the fourth intermediate structure 32 is mounted to the main surface of the third intermediate structure 28 configured so that the micro interconnect circuit section 4 is mounted to the base substrate section 3 fabricated through the above process. As shown in FIG. 19, in the third intermediate structure 28, bonding layer 33 is deposited on the second main surface 4b of the micro interconnect circuit section 4 by application of a bonding material to an area correspondingly to a packaging area of the optical interconnect circuit section 5. Specifically, the bonding layer 33 is subjected to planarization to such an extent that the connection bumps are exposed to a surface of the bonding layer, similarly to the above first main surface 4a-side bonding layer 15, because of a need for attaining electrical connection between the micro interconnect circuit section 4 and the optical interconnect circuit section 5. Alternatively, the bonding layer 33 may be also formed with the bonding material applied to the first main surface 5a of the optical interconnect circuit section 5.

Figure 20:
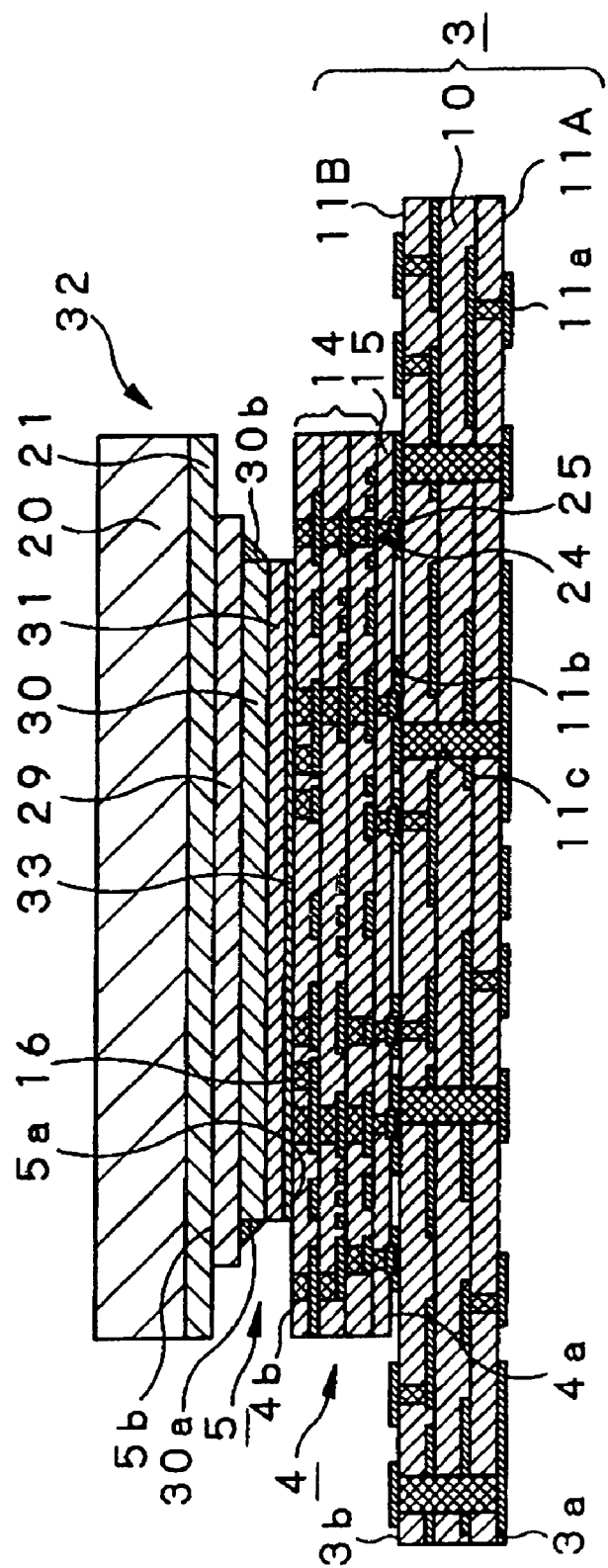
FIG. 20 is a schematic cross-sectional view of a third intermediate structure having the fourth intermediate structure mounted, according to a preferred embodiment of the present invention.

In the process of fabrication of the circuit module 1, the upper cladding layer 31 is bonded to the optical interconnect circuit section 5 through the bonding layer 33 as shown by an arrow of FIG. 19 with the dummy substrate 20 faced down. In the process of fabrication of the circuit module 1, heating under temperature conditions that allow the bonding layer 33 to be hardened takes place in such a way that the first connecting terminals 16 of the micro interconnect circuit section 4 and the connecting terminals 23 of the optical interconnect circuit section 5 are positioned to ensure connection therebetween. In the process of fabrication of the circuit module 1, the fourth intermediate structure 32 is mounted on the third intermediate structure 28 with the optical interconnect circuit section 5 firmly bonded to the micro interconnect circuit section 4, as shown in FIG. 20.

Figure 21:
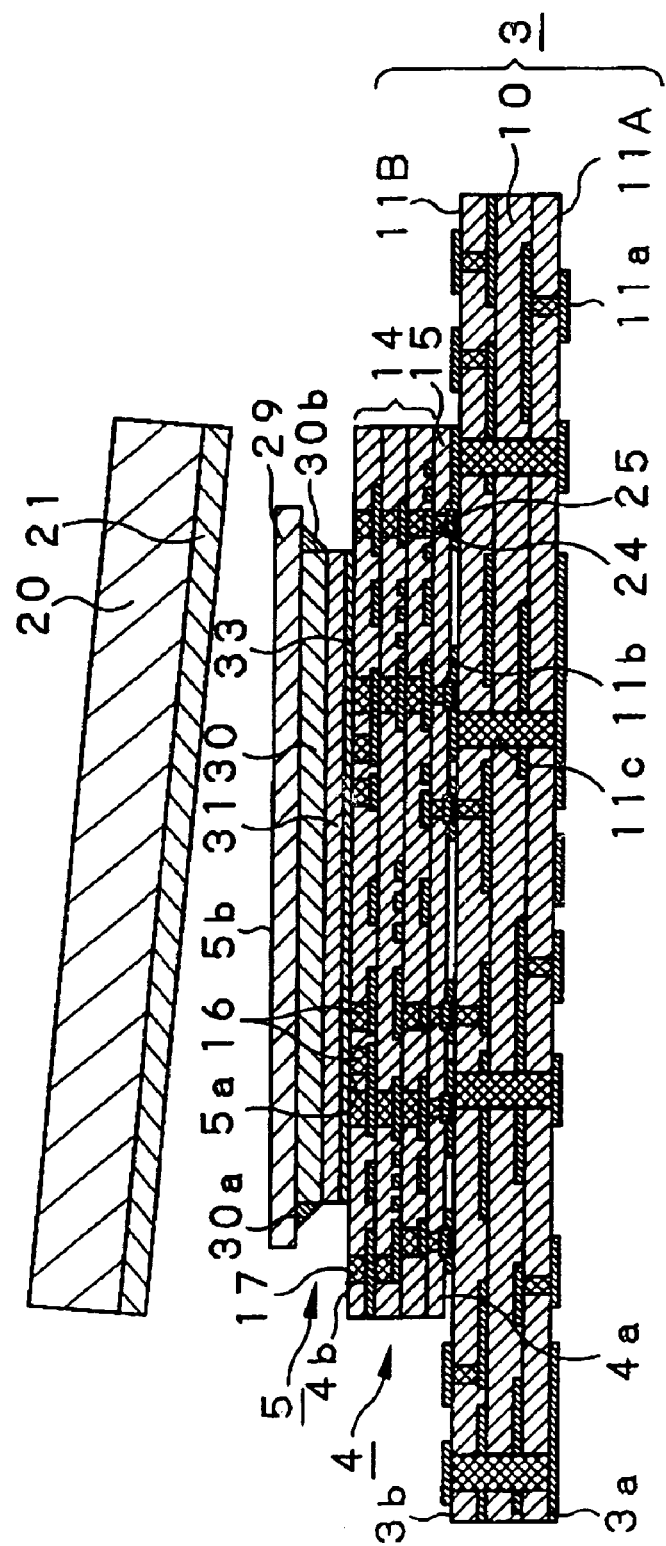
FIG. 21 is a schematic cross-sectional view for describing the process of releasing the dummy substrate from the fourth intermediate structure, according to a preferred embodiment of the present invention.
Figure 22:
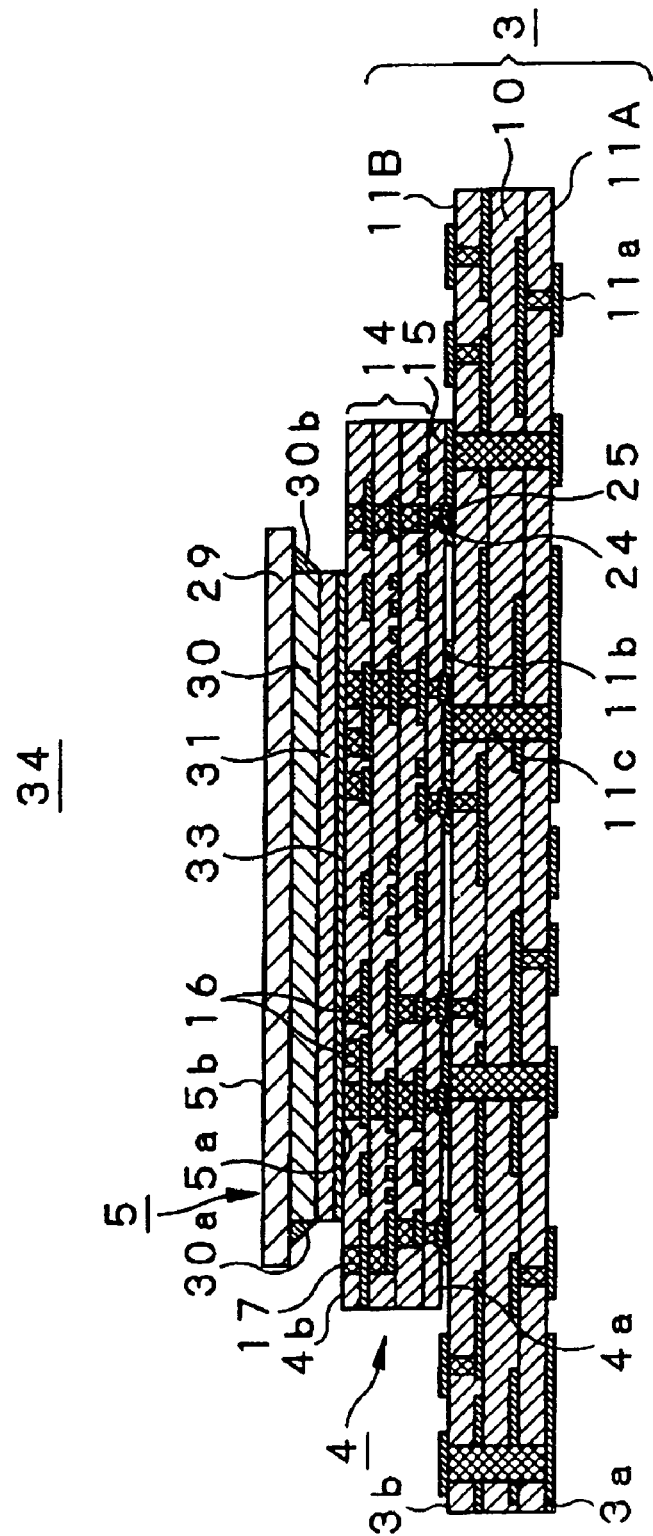
FIG. 22 is a schematic cross-sectional view of a module circuit substrate, according to a preferred embodiment of the present invention.

In the process of fabrication of the circuit module 1, stripping of the dummy substrate 20 through the release layer 21 takes place in such a way as to leave the optical interconnect circuit section 5 on the second main surface 4b of the micro interconnect circuit section 4, as shown in FIG. 21. The dummy substrate 20 is stripped by heating at temperatures equal to or more than a temperature at which the resin material of the release layer 21 becomes releasable or immersion into an acid or alkaline solution, similarly to the stripping of the dummy substrate 12 from the micro interconnect circuit section 4 in the above process of fabrication of the micro interconnect circuit section 4. In the process of fabrication of the circuit module 1, the optical interconnect circuit section 5 is mounted on the base substrate section 3 as it is being on the dummy substrate 20, so that accurate positioning of the optical interconnect circuit section 5 is ensured before mounting, with simplification of the mounting process, similarly to that of typical packaging components, thereby providing a module circuit substrate 34 as shown in FIG. 22.

In the process of fabrication of the circuit module 1, the electronic components 6, the semiconductor chips 7 or the optical elements 8 are supplied and then mounted to the module circuit substrate 34 through electrical connection thereto by re-flow soldering and the like, for instance, thereby providing the circuit module 1 as shown in FIG. 1. The module circuit substrate 34 is mounted with the electronic components 6 on the second main surface 3b of the base substrate section 3 through the connecting terminals 11b. The module circuit substrate 34 is also mounted with the optical interconnect circuit section 5 with the connecting terminals 23 connected to the first connecting terminals 16, together with the semiconductor chips 7 on the second main surface 4b of the micro interconnect circuit section 4 through the second connecting terminals 17. The module circuit substrate 34 is also mounted with the optical elements 8 on the second main surface 5b of the optical interconnect circuit section 5 through the connecting terminals 23.

In the process of fabrication of the circuit module 1, the dummy substrate 20 is employed to fabricate the optical interconnect circuit section 5 on the flat main surface 20a thereof as described above, so that it becomes easy to form an accurate optical wave-guide 9. In addition, in the process of fabrication of the circuit module 1, the base substrate section 3, the micro interconnect circuit section 4 or the optical interconnect circuit section 5 are separately fabricated into a multi layer structure, so that accurate fabrication of the circuit module is ensured in a rational process without being affected by chemicals and/or temperature conditions required for each fabrication process on individual sections.

Further, in the process of fabrication of the circuit module 1, not only accurate mounting of the semiconductor chips 7 to the micro interconnect circuit section 4 but also that of the optical elements 8 to the optical interconnect circuit section 5 is ensured. In the process of fabrication of the circuit module 1, the optical interconnect circuit section 5 is mounted in the faced-down manner on the micro interconnect circuit section 4 as described above, so that easy alignment of the optical elements 8 with the photo detecting section 9b and the light emitting section 9a is ensured, with easy formation of the optical wave-guide 9 having the optical path-changeable reflection mirror face 30.

In the above embodiment, the circuit module 1 is configured with the multi layer structure obtained by stacking the micro interconnect circuit section 4 mounted on the base substrate section 3 and the optical interconnect circuit section 5 mounted on the micro interconnect circuit section 4. However, the preferred embodiment of the present invention is by no means limited to the above multi layer structure. In the process of fabrication of the circuit module 1, the micro interconnect circuit section 4 and the optical interconnect circuit section 5 may be bonded together into one unite structure in advance of mounting to the base substrate section 3, instead of the process of mounting the optical interconnect circuit section 5 to the micro interconnect circuit section 4 already mounted on the base substrate section 3.

Figure 23:
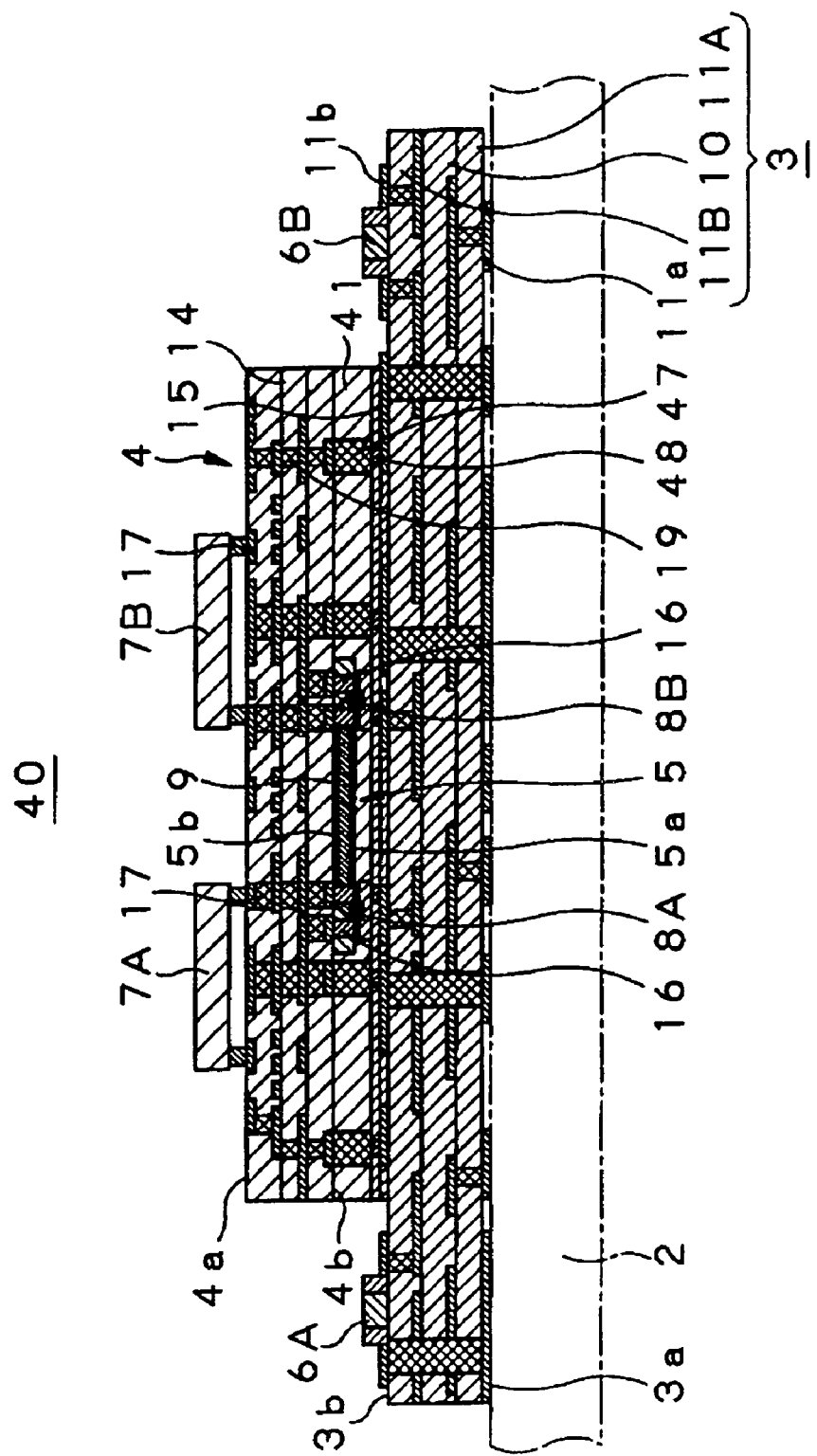
FIG. 23 is a schematic cross-sectional view of a hybrid circuit module with optical and electrical interconnects embedded, according to a second preferred embodiment of the present invention.

FIG. 23 shows a circuit module 40 as a second embodiment of the preferred embodiment of the present invention, and this circuit module 40 is also a hybrid circuit module with optical and electrical interconnects embedded. Specifically, the circuit module 40 comprises a multi layer structure composed of the base substrate section 3, the micro interconnect circuit section 4 and the optical interconnect circuit section 5, which are fabricated separately in the similar manner to that of the circuit module 1. The circuit module 40 is characterized by a multi layer structure configuration obtained by incorporating the optical interconnect circuit section 5 in the micro interconnect circuit section 4.

The circuit module 40 is designed to have a multi layer structure, in which the order of the micro interconnect circuit section 4 and the optical interconnect circuit section 5 stacked on the base substrate section 3 is reversed, as compared with the multi layer structure of the circuit module 1. Thus, in the circuit module 40, the micro interconnect circuit section 4 and the optical interconnect circuit section 5 are different from those of the circuit module 1 in detailed configurations and/or deposited layer configurations on the dummy substrates 12 and 20. However, the basic configurations of the individual sections of the circuit module 40 are similar to those of the circuit module 1, and like or corresponding members or portions are given by like reference numerals in the following, so detailed descriptions thereof will be omitted.

The circuit module 40 ensures passivation layer of the optical wave-guide 9 and optical noise impact reductions, with increased packaging density of the electronic components 6 and/or the semiconductor chips 7 to the micro interconnect circuit section 4, by incorporating the optical interconnect circuit section 5 in the micro interconnect circuit section 4. The circuit module 40 is configured so that the micro interconnect circuit section 4 with the optical interconnect circuit section 5 incorporated therein is bonded to the base substrate section 3 through the bonding layer 15. The circuit module 40 needs to surely insulate the micro interconnect circuit section 4 and the optical interconnect circuit section 5 from the base substrate section 3, so that an insulating layer 41 is deposited on a bottom face of a bonded structure composed of the micro interconnect circuit section 4 and the optical interconnect circuit section 5, as will be described later in detail.

The circuit module 40 is similar in configurations of the micro interconnect circuit section 4 and the optical interconnect circuit section 5 to the circuit module 1, except that the micro interconnect circuit section 4 and the optical interconnect circuit section 5 are combined in the reverse order with the base substrate section 3. In the circuit module 40, the optical elements 8 are mounted at the main surface 5a-side of the optical interconnect circuit section 5, and the optical interconnect circuit section 5 is incorporated in the micro interconnect circuit section 4 in such a way that the optical elements 8 are substantially flush with the insulating layer 41. Thus, in the circuit module 40, the micro interconnect circuit section 4 and the optical interconnect circuit section 5 are mounted on the second main surface 3b of the base substrate section 3 with the insulating layer 41 as the component side.

The circuit module 40 has input/output terminals of an information signal on the second main surface 4b-side of the micro interconnect circuit section 4, with a power supply terminal on the second main surface 3b of the base substrate section 3, although not shown in details. In the circuit module 40, the optical elements 8 allow the power supply terminal to be connected to the power supply terminal of the base substrate section 3, and the input/output terminals on the first main surface 5a-side to be connected to the input/output terminals of the micro interconnect circuit section 4. In the circuit module 40, the optical elements 8 are of course mounted on the first main surface 5a of the optical interconnect circuit section 5 with the optical input/output sections respectively facing the photo detecting section 9a and the light emitting section 9b of the optical wave-guide 9.

With the circuit module 40, the power supply having high regulation also takes place from the base substrate section 3 having the power line and the ground line with a sufficient area ensured to the micro electrical interconnect layer 14 of the micro interconnect circuit section 4 and/or the optical elements 8 of the optical interconnect circuit section 5. The circuit module 40 ensures cost reductions as a whole, because of its advantages that not only the base substrate section 3 is fabricated at low cost but also accurate passive elements are deposited in the separately fabricated micro interconnect circuit section 4 with an accurate circuit pattern.

The circuit module 40 also ensures accurate mounting of the optical interconnect circuit section 5, with that of highly integrated or pin-enhanced semiconductor chips 7, on the first main surface 4a of the micro interconnect circuit section 4. The circuit module 40 also ensures parasitic capacity reductions with reduced interconnection placement and routing and hence, high speed transmission with increased capacity of the information signal, because of its advantages that not only a connection interval between the semiconductor chips 7 and the optical elements 8 is reduced but also connection between the optical elements 8 is performed with the optical wave-guide 9.

In the circuit module 40, the micro interconnect circuit section 4 and the optical interconnect circuit section 5 are also fabricated separately from the base substrate section 3 likewise the process of fabrication of the circuit module 1. In the process of fabrication of the circuit module 40, the micro interconnect circuit section 4 and the optical interconnect circuit section 5 are respectively fabricated on the dummy substrate 12 having the release layer 13 and the dummy substrate 20 having the release layer 21 in the similar manner to the process of fabrication of the circuit module 1, so that detailed descriptions on individual fabrication processes will be omitted. In the process of fabrication of the circuit module 40, the micro interconnect circuit section 4 is configured so that the micro electrical interconnect layer 14 of a multi layer structure is deposited with a first main surface 4a-side layer as a first layer for the dummy substrate 12.

Figure 24:
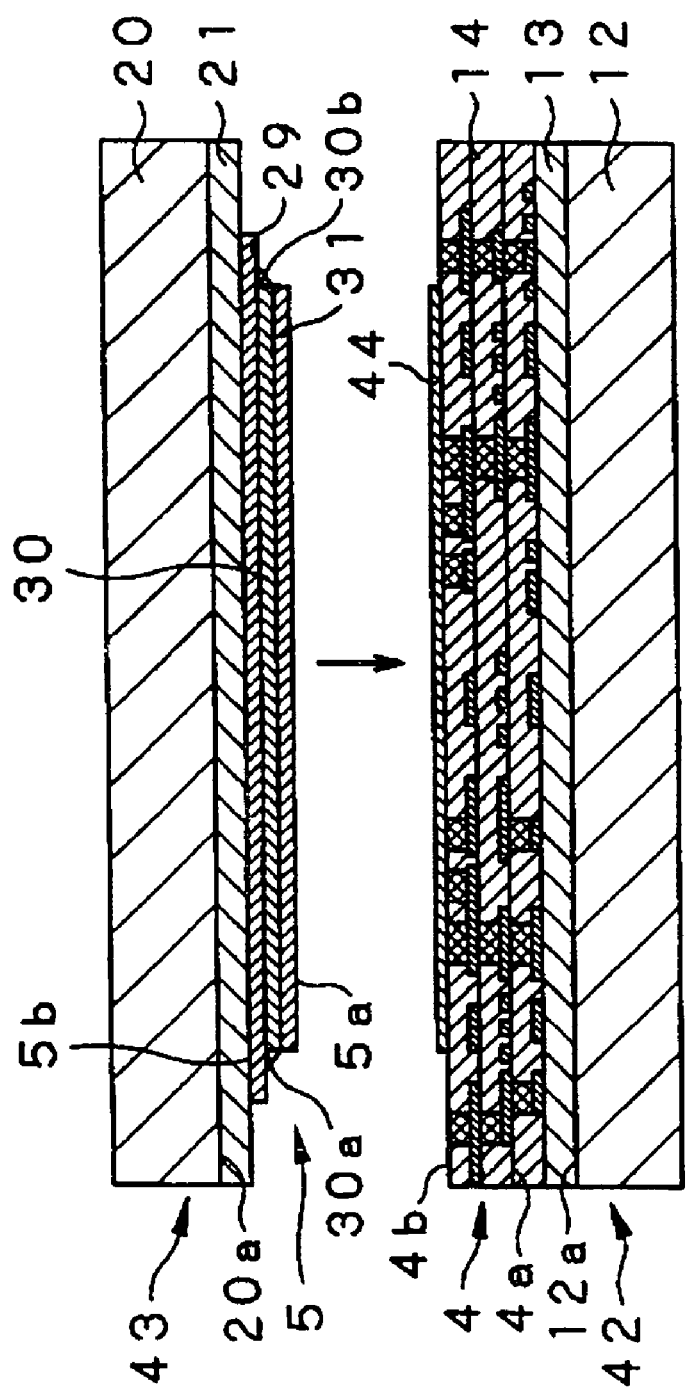
FIG. 24 is a schematic cross-sectional view for describing the process of bonding an intermediate structure of the micro interconnect circuit section having the micro interconnect circuit section formed on the dummy substrate with an intermediate structure of the optical interconnect circuit section having the optical interconnect circuit section formed on the dummy substrate, according to a preferred embodiment of the present invention.

In the process of fabrication of the circuit module 40, an optical interconnect circuit intermediate structure 43 with the optical interconnect circuit section 5 held to the main surface 20a of the dummy substrate 20 is bonded to a micro interconnect circuit intermediate structure 42 with the micro interconnect circuit section 4 held to the main surface 12a of the dummy substrate 12, as shown in FIG. 24. In bonding, a bonding layer 44 is deposited on the main surface of the micro interconnect circuit intermediate structure 42, that is, the second main surface 4b of the micro interconnect circuit section 4 by application of a bonding material to an area corresponding to a packaging area of the optical interconnect circuit section 5. Alternatively, the bonding layer 44 may be also deposited at the optical interconnect circuit section 5-side.

Figure 25:
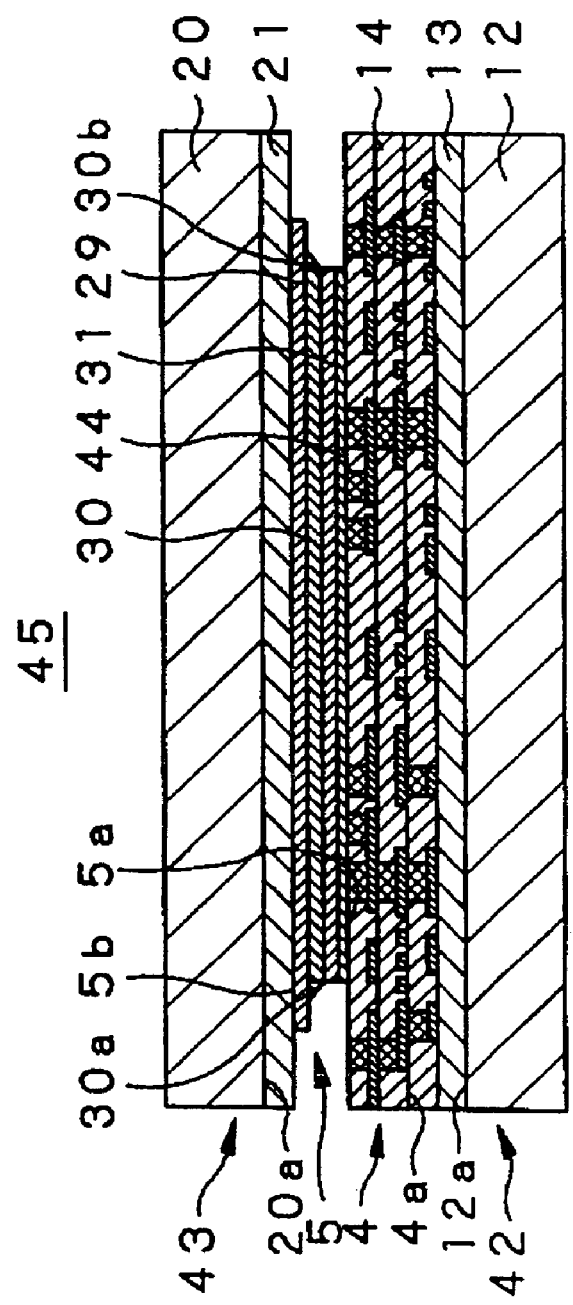
FIG. 25 is a schematic cross-sectional view showing a multi layer structure bonding the intermediate structure of the micro interconnect circuit section and the intermediate structure of the optical interconnect circuit section, according to a preferred embodiment of the present invention.

In the bonding, the first main surface 5a of the optical interconnect circuit section 5 is faced to the second main surface 4b of the micro interconnect circuit section 4 for alignment to put the micro interconnect circuit intermediate structure 42 and the optical interconnect circuit intermediate structure 43 one upon another as shown by an arrow of FIG. 24. In the bonding, the micro interconnect circuit intermediate structure 42 and the optical interconnect circuit intermediate structure 43 are united into a multi layer structure 45 through the bonding layer 44 as shown in FIG. 25 by allowing the bonding material to be hardened by heating, for instance.

Figure 26:
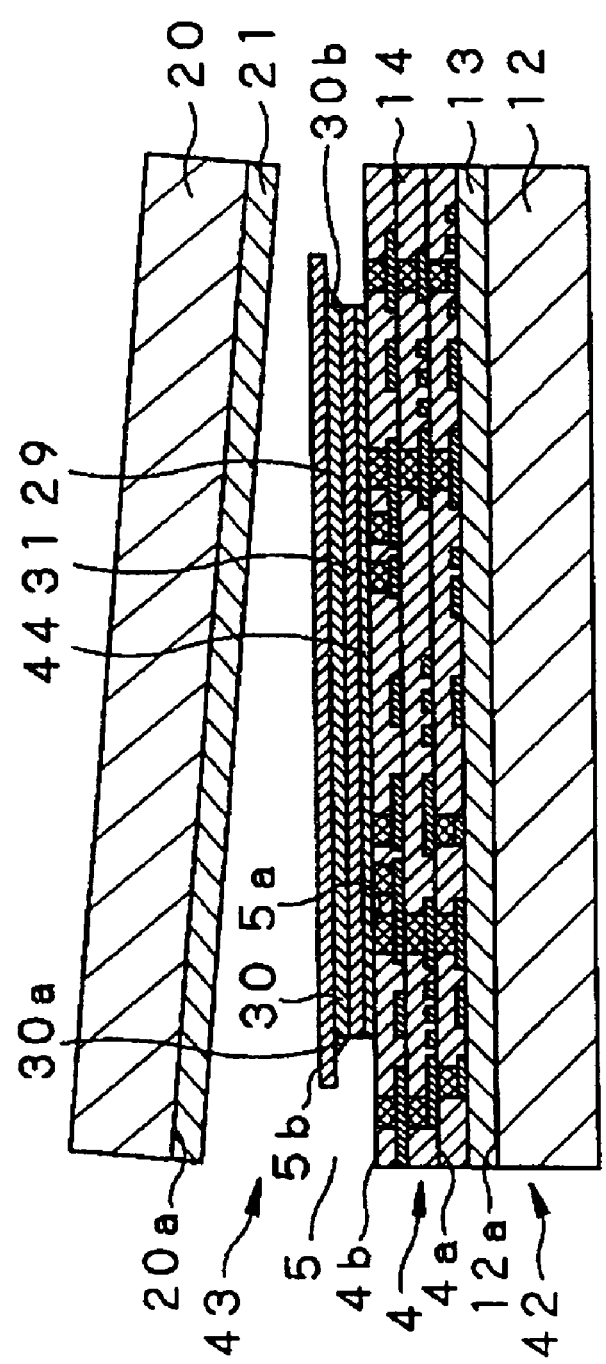
FIG. 26 is a schematic cross-sectional view for describing the process of releasing the dummy substrate from the intermediate structure of the optical interconnect circuit section of the multi layer structure, according to a preferred embodiment of the present invention.

In the process of fabrication of the circuit module 40, the dummy substrate 20 at the side of the optical interconnect circuit intermediate structure 43 is stripped from the multi layer structure 45 obtained by uniting the micro interconnect circuit intermediate structure 42 and the optical interconnect circuit intermediate structure 43 through the above bonding. Stripping takes place by subjecting the multi layer structure 45 to heating at temperatures equal to or more than a temperature at which the resin material of the release layer 21 becomes releasable or immersion into an acid or alkaline solution. Thus, the dummy substrate 20 is stripped from the multi layer structure 45 through the release layer 21 with the optical interconnect circuit section 5 left on the second main surface 4b of the micro interconnect circuit section 4, as shown in FIG. 26.

Figure 27:
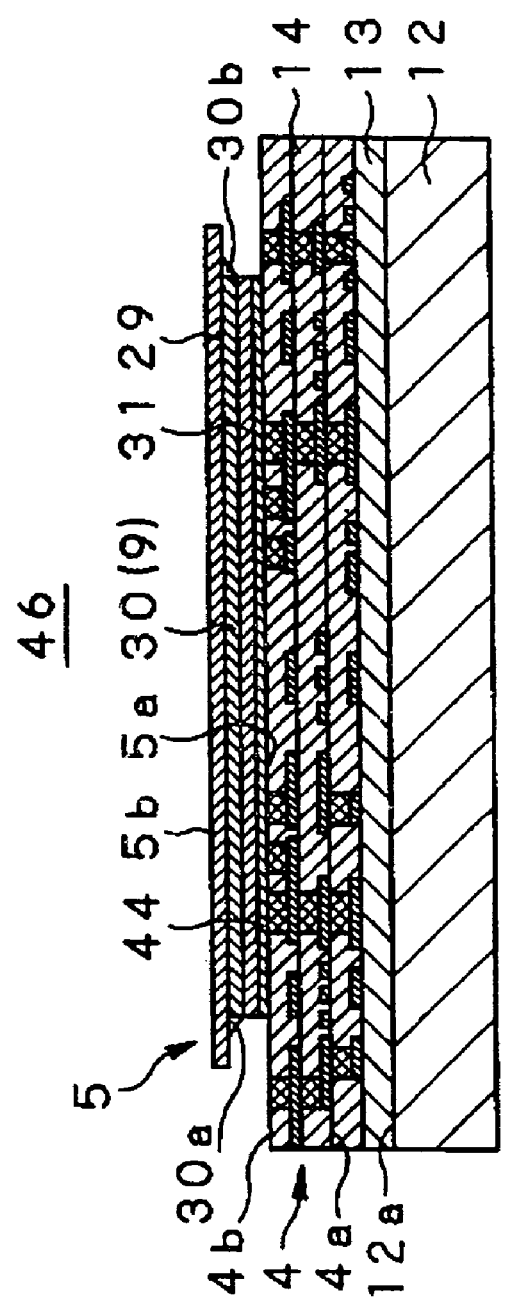
FIG. 27 is a schematic cross-sectional view of a second multi layer structure.
Figure 28:
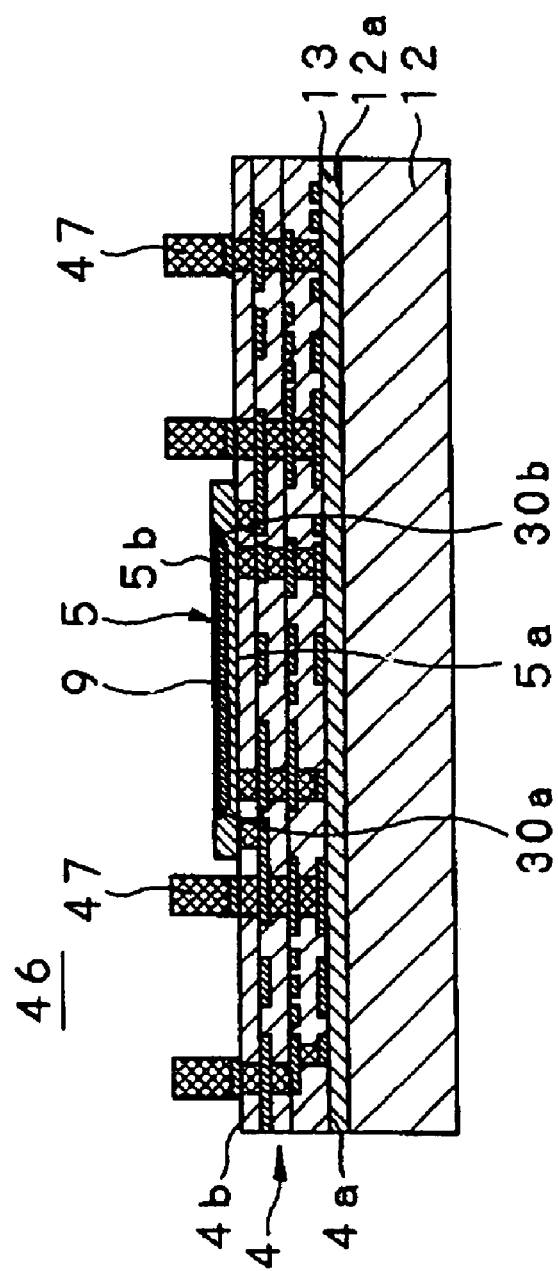
FIG. 28 is a schematic cross-sectional view for describing the process of forming a connection post, according to a preferred embodiment of the present invention.

In the process of fabrication of the circuit module 40, stripping the dummy substrate 20 from the optical interconnect circuit section 5 provides a second multi layer structure 46 configured so that the micro interconnect circuit section 4 and the optical interconnect circuit section 5 are stacked on the dummy substrate 12, as shown in FIG. 27. In addition, the second multi layer structure 46 is then subjected to terminal processing required for attaining connection to the base substrate section 3 and/or mounting of the optical elements 8. In the terminal processing, a large number of connection posts 47 are bonded using an additive method employing copper plating, for instance, at predetermined positions of the interconnect pattern on the second main surface 4b of the micro interconnect circuit section 4, as shown in FIG. 28. The connection posts 47 are formed to have a given thickness, respectively.

Figure 29:
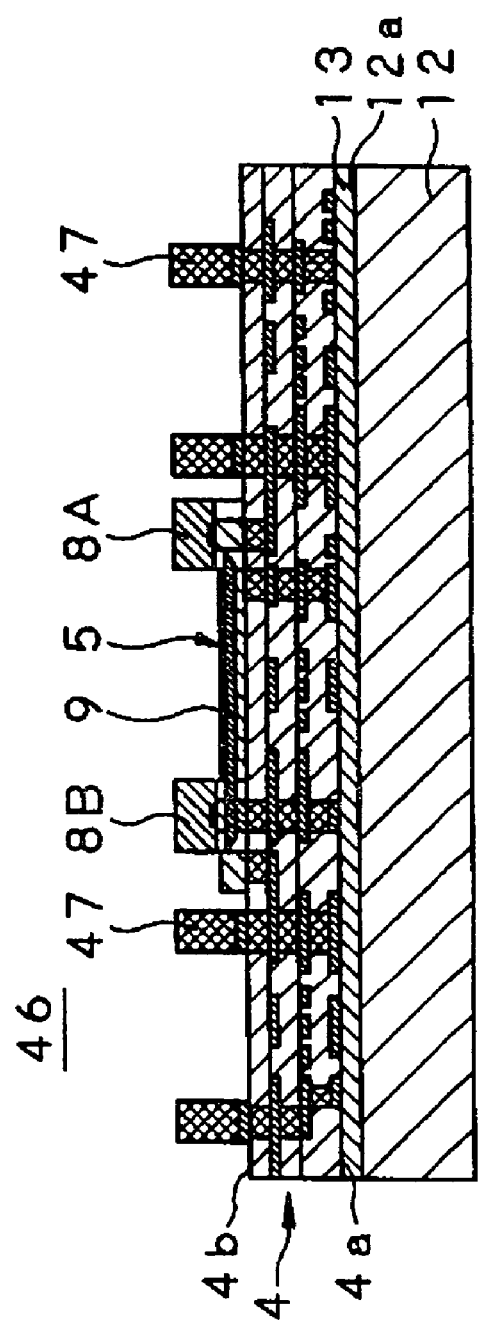
FIG. 29 is a schematic cross-sectional view for describing the process of mounting an optical element, according to a preferred embodiment of the present invention.

In the process of fabrication of the circuit module 40, the optical elements 8 are mounted on the second main surface 5b of the optical interconnect circuit section 5 in such a way as to align the light emitting section and the photo detecting section with the photo detecting section 9a and the light emitting section 9b of the optical wave-guide 9, as shown in FIG. 29. In the process of fabrication of the circuit module 40, the optical interconnect circuit section 5 is mounted on the micro interconnect circuit section 4, so that it is allowable to mount the optical elements 8. Alternatively, in the process of fabrication of the circuit module 40, mounting of the optical elements 8 and bonding of the connection posts 47 may take place in the reversed order. Alternatively, in the mounting of the optical elements 8, the optical elements 8 may be also sealed with a transparent resin material and the like, for instance, at need.

Figure 30:
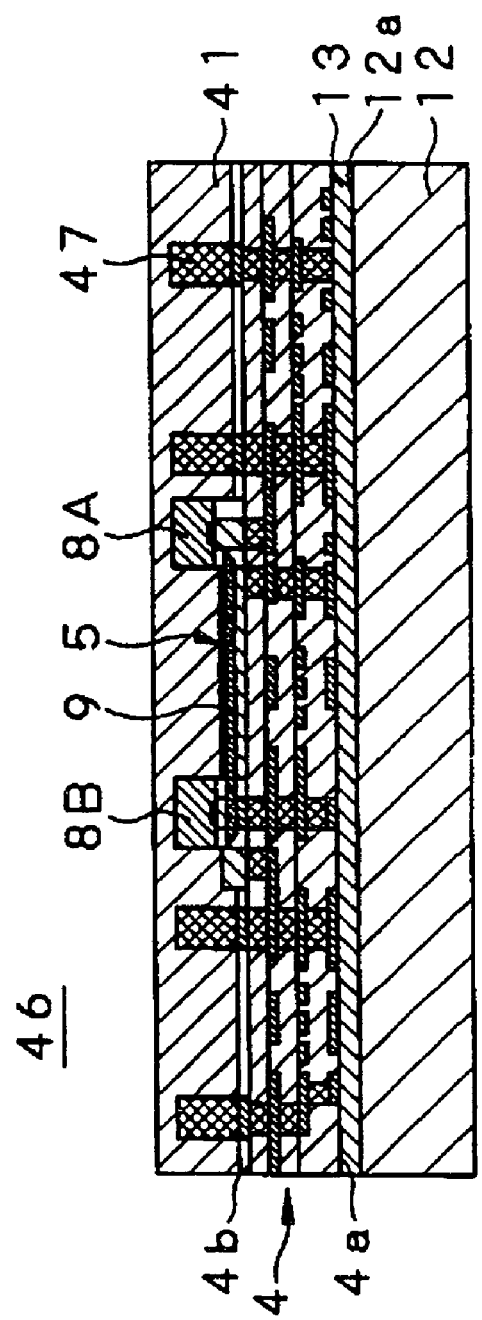
FIG. 30 is a schematic cross-sectional view for describing the process of forming an insulation layer, according to a preferred embodiment of the present invention.
Figure 31:
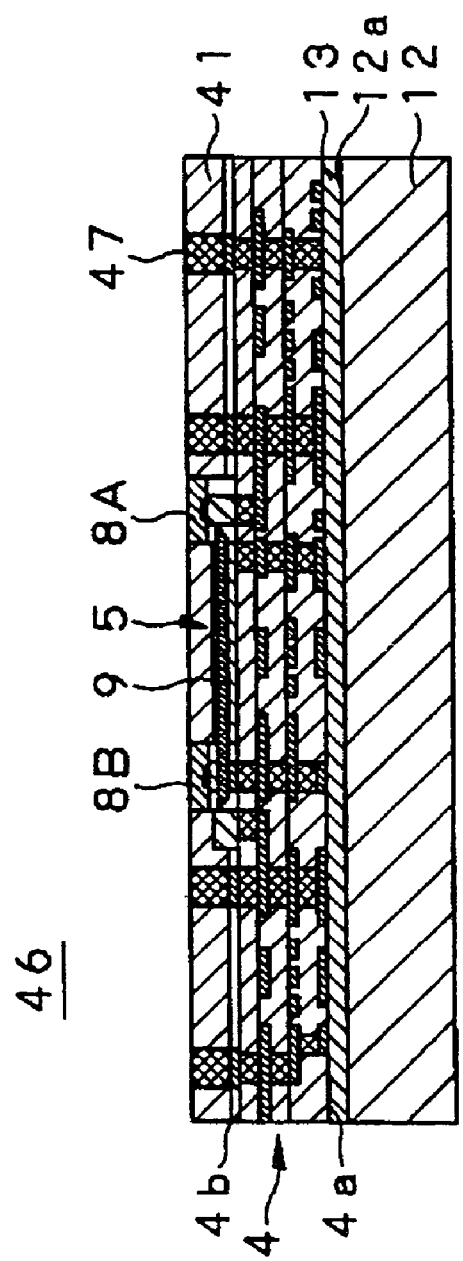
FIG. 31 is a schematic cross-sectional view for describing the process of polishing an insulation layer, according to a preferred embodiment of the present invention.

In the process of fabrication of the circuit module 40, the insulating layer 41 is deposited with an insulating resin material so as to wholly cover the second main surface 4b of the micro interconnect circuit section 4 and the second main surface 5b of the optical interconnect circuit section 5, as shown in FIG. 30. The insulating layer 41 ensures mechanical protection, with sure insulation of the micro interconnect circuit section 4 and the optical interconnect circuit section 5 from the base substrate section 3. In the process of fabrication of the circuit module 40, the insulating layer 41 is subjected to chemical-mechanical polishing, for instance. In polishing of the insulating layer 41, the optical elements 8 are also polished to such an extent that functions thereof may not be damaged, as shown in FIG. 31, resulting in contribution toward whole thickness reductions. The polishing allows the optical elements 8 and the connection posts 47 to be exposed to the surface of the insulating layer 41 so as to be flush with the insulating layer 41.

Figure 32:
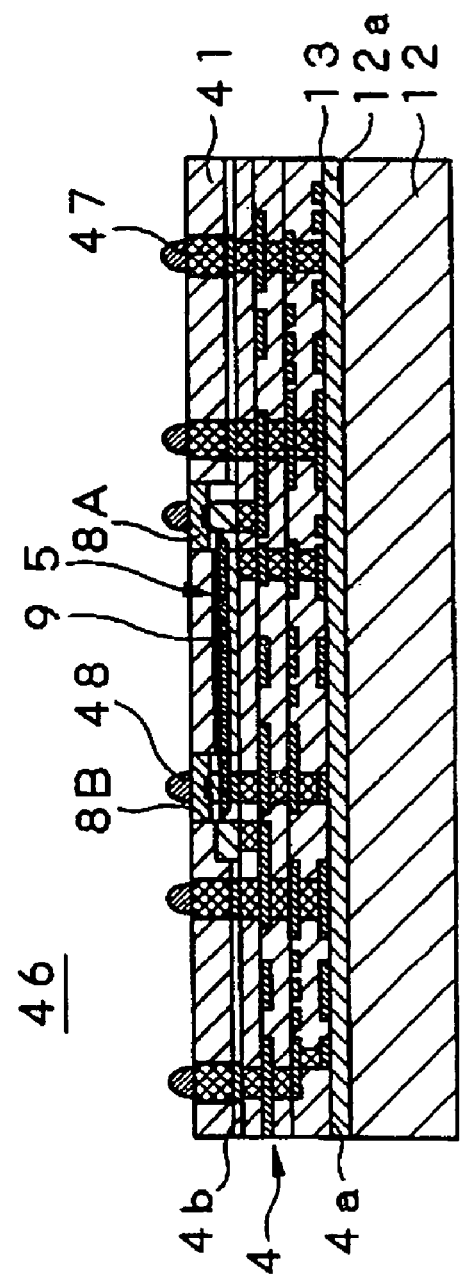
FIG. 32 is a schematic cross-sectional view for describing the process of forming a connection bump, according to a preferred embodiment of the present invention.

In the process of fabrication of the circuit module 40, connection bumps 48 adapted to electrical connection to the base substrate section 3 are bonded to the optical elements 8 and the connection posts 47 that are exposed to the surface of the insulating layer 41, as shown in FIG. 32. In bonding of the connection bumps 48, the connection bumps 48 consisting of copper posts of a predetermined thickness are formed by electroplating with copper using a semi-additive method, for instance. Alternatively, the connection bumps 48 may be one obtained by bonding solder bumps to the optical elements 8 and the connection posts 47.

Figure 33:
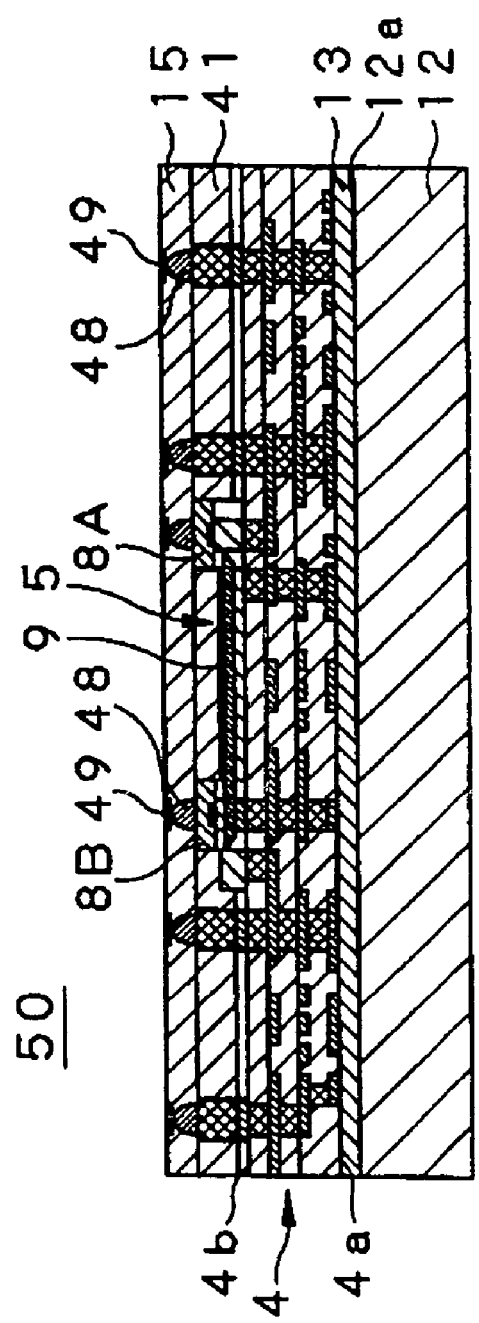
FIG. 33 is a schematic cross-sectional view for describing the process of forming a bonding layer, according to a preferred embodiment of the present invention.

In the process of fabrication of the circuit module 40, the bonding layer 15 is deposited on the main surface of the second multi layer structure 46 so as to cover the connection bumps 48. The bonding layer 15 is formed by application of a thermosetting resin bonding material having properties of providing a semi-hardened state with the heating temperature conditions as described above. The bonding layer 15 is polished to such an extend that the connection bumps 4 are exposed to the surface of the bonding layer. In the process of fabrication of the circuit module 40, solder bumps 49 are respectively bonded to the connection bumps 48 exposed to the surface of the bonding layer 15, thereby providing a third multi layer structure 50 with the optical interconnect circuit section 5 incorporated in the micro interconnect circuit section 4 as shown in FIG. 33. It is noted that no solder bump 49 is required, when the connection bumps 48 employing the solder bumps are in use.

Figure 34:
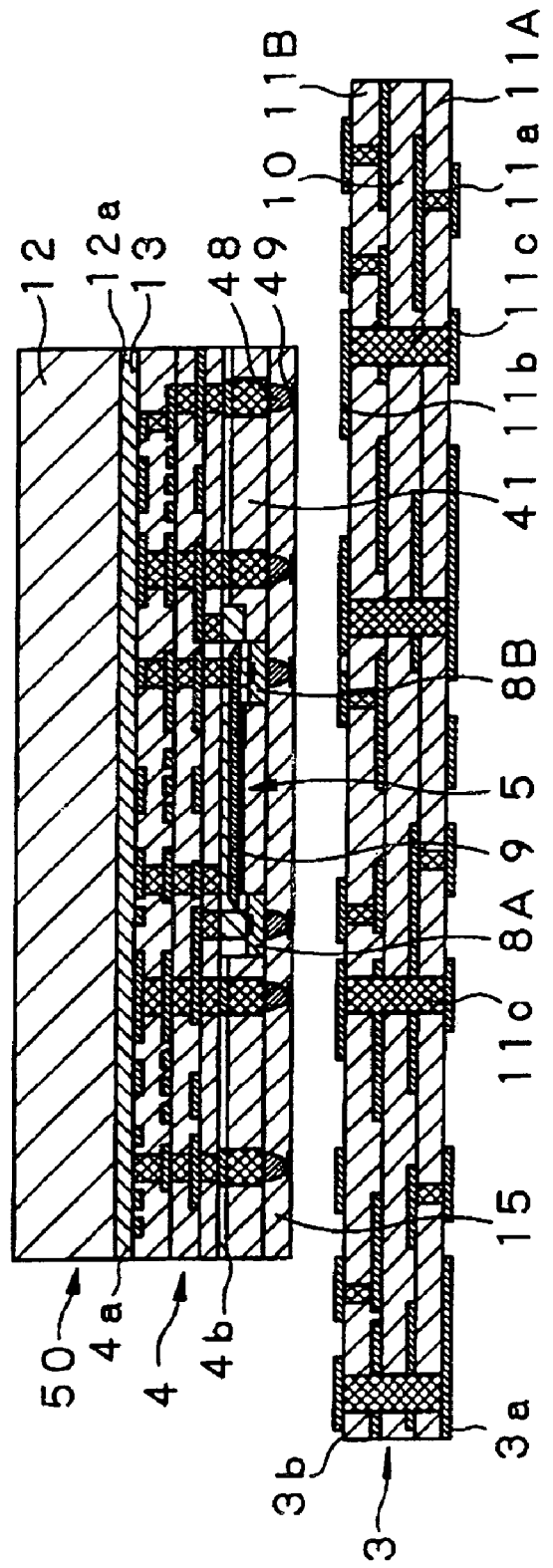
FIG. 34 is a schematic cross-sectional view for describing the process of mounting the third multi layer structure on the base substrate section, according to a preferred embodiment of the present invention.
Figure 35:
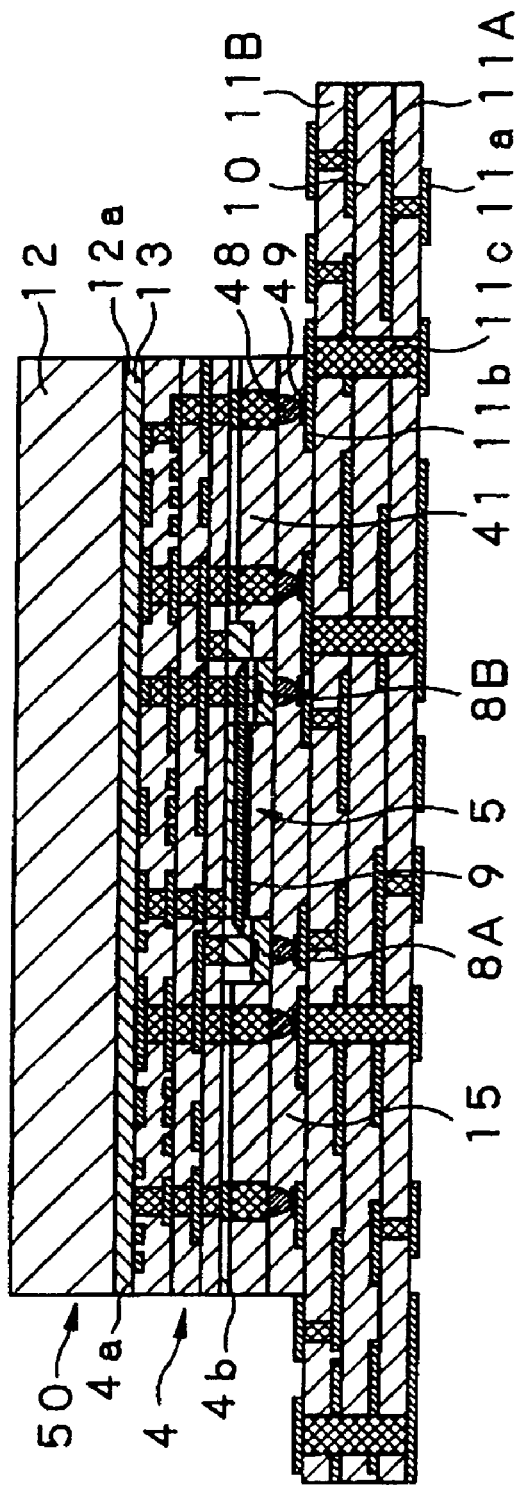
FIG. 35 is a schematic cross-sectional view for describing the fourth multi layer structure, according to a preferred embodiment of the present invention.
Figure 36:
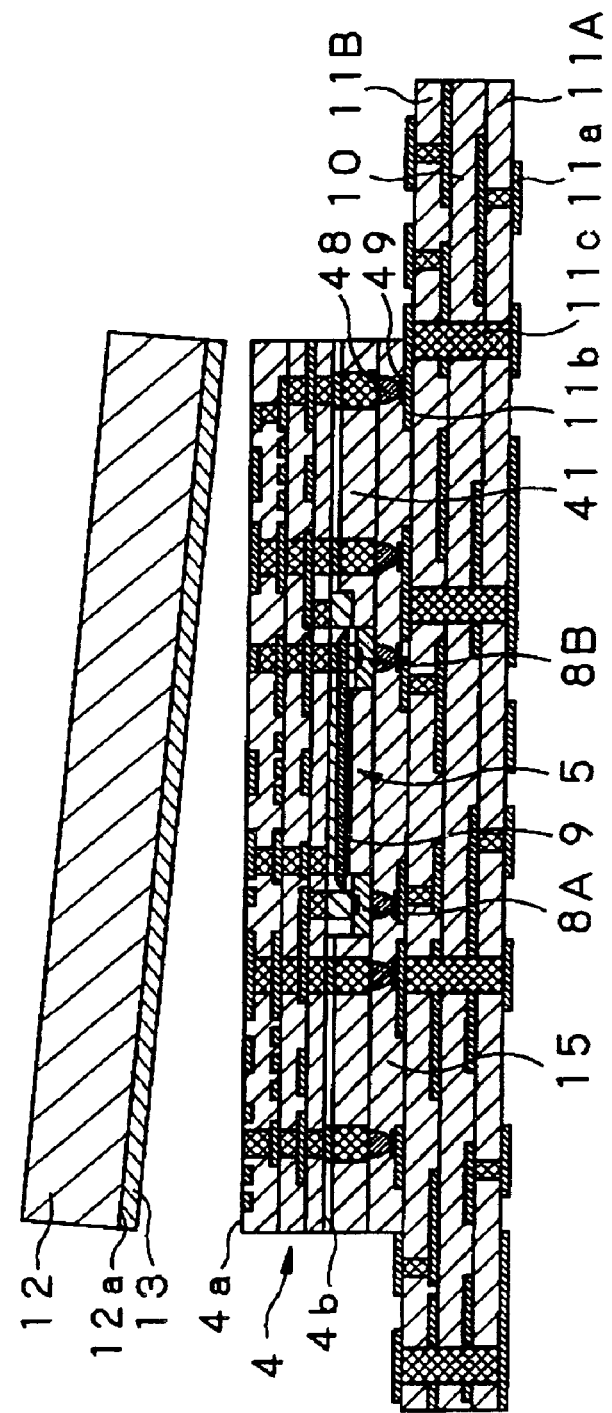
FIG. 36 is a schematic cross-sectional view for describing the process of releasing the dummy substrate from the fourth multi layer structure, according to a preferred embodiment of the present invention.

In the process of fabrication of the circuit module 40, the third multi layer structure 50 thus fabricated through the above process is mounted on the second main surface 3b of the base substrate section 3. The third multi layer structure 50 is positioned on the second main surface 3b before being combined with the base substrate section 3 by being faced down with the bonding layer 15 as the component side for the base substrate section 3 as shown in FIG. 34. In the process of fabrication of the circuit module 40, the base substrate section 3 combined with the third multi layer structure 50 is heated under temperature conditions that allow the bonding layer 15 to be hardened. In the process of fabrication of the circuit module 40, a fourth multi layer structure 51 is fabricated, in which the third multi layer structure 40 is firmly bonded to the base substrate section 3 with the solder bumps 49 melted by re-flow soldering, as shown in FIG. 35.

Figure 37:
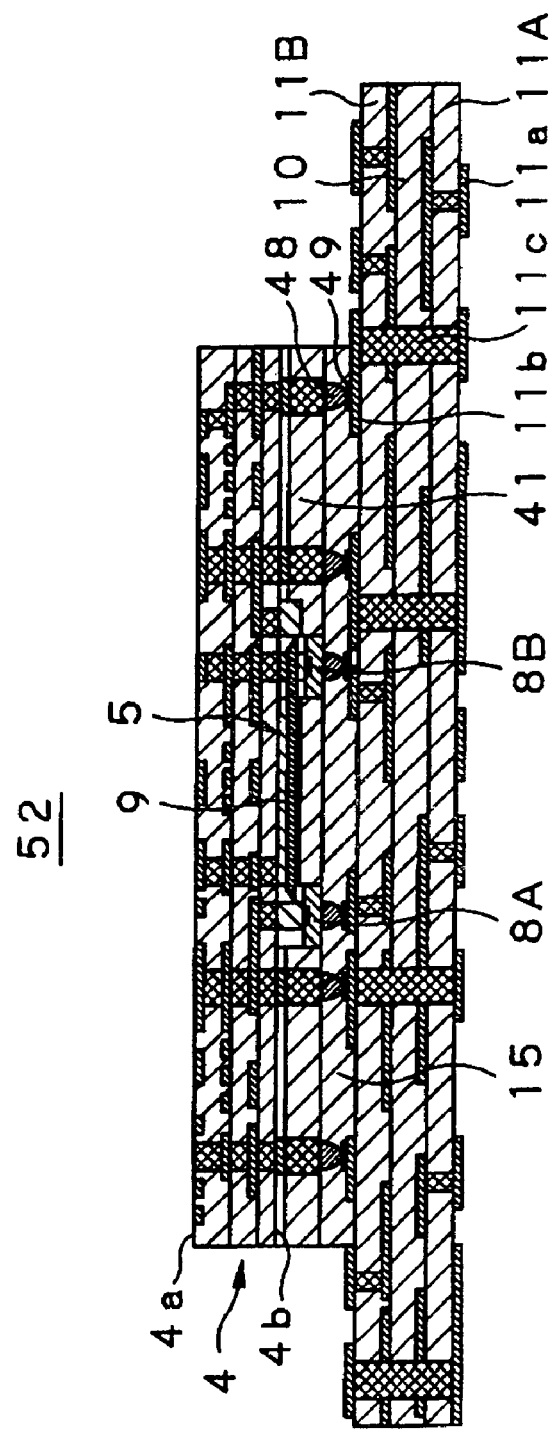
FIG. 37 is a schematic cross-sectional view for describing the module circuit substrate, according to a preferred embodiment of the present invention.

In the process of fabrication of the circuit module 40, the fourth multi layer structure 51 is cooled down in a predetermined manner, before stripping of the dummy substrate 12 through the release layer 13 takes place so as to leave the multi layer structure composed of the micro interconnect circuit section 4 and the optical interconnect circuit section 5 on the base substrate section 3. In the stripping, the dummy substrate 12 is stripped by heating at temperatures equal to or more than a temperature at which the resin material of the release layer 13 becomes releasable or immersion into an acid or alkaline solution, for instance, thereby providing a module circuit substrate 52 configured so that the micro interconnect circuit section 4 with the optical interconnect circuit section 5 incorporated therein is mounted on the base substrate section 3, as shown in FIG. 37.

In the process of fabrication of the circuit module 40, the electronic components 6, the semiconductor chips 7 or the optical elements 8 are supplied and then mounted on the module circuit substrate 52 through electrical connection thereto by re-flow soldering and the like, thereby providing the above circuit module 40 as shown in FIG. 23. In the process of fabrication of the circuit module 40, the dummy substrate 20 is employed to fabricate the optical interconnect circuit section 5 on the flat main surface 20a thereof as described above, so that it becomes easy to form an accurate optical wave-guide 9. In addition, in the process of fabrication of the circuit module 40, the base substrate section 3 and the micro interconnect circuit section 4 or the optical interconnect circuit section 5 are separately fabricated into the multi layer structure to provide the module circuit substrate 52, so that accurate fabrication of the circuit module is ensured in a rational process without being affected by chemicals and/or temperature conditions required for each fabrication process on the individual sections.

In the process of fabrication of the circuit module 40, accurate mounting of the semiconductor chips 7 to the micro interconnect circuit section 4 is ensured, with that of the optical elements 8 to the optical interconnect circuit section 5. In the process of fabrication of the circuit module 40, the optical interconnect circuit section 5 and the micro interconnect circuit section 4 are combined into one unite structure as described above, before being mounted on the base substrate section 3, so that easy alignment of the photo detecting section 9a and the light emitting section 9b with the optical elements 8 is ensured, with accurate electrical connection between the optical elements 8 and the base substrate section 3. In the process of fabrication of the module circuit 40, the module circuit substrate 52 with the optical interconnect circuit section 3 incorporated in the micro interconnect circuit section 4 is fabricated. Thus, an accurate module circuit substrate 52 is provided, which ensures passivation layer of the optical wave-guide 9 and optical noise impact reductions, with increased packaging density of the electronic components 6 or the semiconductor chips 7 to the micro interconnect circuit section 4.

In the process of fabrication of the circuit module 40, the processes such as formation of the connection posts 47 and/or the connection bumps 48 and bonding of the solder bumps 49 are applied to mounting of the micro interconnect circuit section 4 to the base substrate section 3 through electrical connection thereto. Alternatively, it is noted that the preferred embodiment of the present invention is by no means limited to the above connection structure. In the process of fabrication of the circuit module 40, it is allowable to mount the micro interconnect circuit section 4 to the base substrate section 3 through a conventionally prevailing surface mount structure.

In the above circuit module 1 or 40, the optical interconnect circuit section 5 is sized smaller than the micro interconnect circuit section 4 is mounted on the main surface of the micro interconnect circuit section 4 or incorporated therein. However, the preferred embodiment of the present invention is by no means limited to the above structure. Alternatively, the circuit module may be also designed to mount the optical interconnect circuit section 5 to the micro interconnect circuit section 4 in such a way that the optical interconnect circuit section 5 is fabricated larger than the micro interconnect circuit section 4 so as to have a proper electrical interconnect pattern and/or connecting terminals, together with the optical wave-guide 9. In this case, the electronic components 6 and the semiconductor chips 7 are mounted on the above optical interconnect circuit section 5 through the connecting terminals.

Although the present invention has been described hereinabove in its preferred form with a certain degree of particularity, many other changes, variations, combinations and sub-combinations are possible therein. It is therefore to be understood by those of ordinary skill in the art that any modifications will be practiced otherwise than as specifically described herein without departing from the scope and spirit of the present invention.

What is claimed is:

1. A hybrid circuit substrate manufacturing method for manufacturing a hybrid circuit substrate with optical and electrical interconnects, comprising the steps of:

manufacturing a base substrate section having an interconnect layer formed on an insulating substrate using a printed circuit manufacturing process;

manufacturing a micro interconnect circuit section having a micro electrical interconnect layer which is finer than the interconnect layer of the base substrate section and having first and second mounting surfaces using a semiconductor manufacturing process;

manufacturing an optical interconnect circuit section adapted to transfer and/or receive an optical signal and provided with an optical wave-guide having an input section and an output section for output of an optical signal at opposite ends thereof and an optical element composed of a light emitting device with a light emitting section thereof facing the input section and a photo detecting device with a photo detecting section thereof facing the output section;

mounting said micro interconnect circuit section and said optical interconnect circuit section on said base substrate section by first mounting said micro interconnect circuit section on a surface of said base substrate section with said first mounting surface facing said base substrate section; and mounting said optical interconnect circuit section on said second mounting surface of said micro interconnect circuit section, wherein, said micro interconnect circuit section and said optical interconnect circuit section are stacked on said base substrate section.

2. A hybrid circuit substrate manufacturing method for manufacturing a hybrid circuit substrate with optical and electrical interconnects, comprising the steps of:

manufacturing a base substrate section having an interconnect layer formed on an insulating substrate using a printed circuit manufacturing process;

forming an insulation resin layer on a release layer of a dummy substrate, wherein said dummy substrate includes one of a silicon substrate and a glass substrate having said release layer formed on a planarized surface thereof;

manufacturing on said dummy substrate insulation resin layer a micro interconnect circuit section;

forming said micro interconnect circuit section by including at least one micro electric interconnect layer which is finer than a interconnect layer of said base circuit section, on said insulation resin layer by a semiconductor process;

releasing said micro interconnect circuit section from said dummy substrate using said release layer manufacturing an optical interconnect circuit section adapted to transfer and/or receive an optical signal and provided with an optical wave-guide having an input section and an output section for output of an optical signal at opposite ends thereof and an optical element composed of a light emitting device with a light emitting section thereof facing the input section and a photo detecting device with a photo detecting section thereof facing the output section;

mounting said micro interconnect circuit section and said optical interconnect circuit section on said base substrate section in a stacked arrangement; and providing transmission channels for an electrical signal and an optical signal.

3. The hybrid circuit substrate manufacturing method according to claim 2, wherein said micro interconnect circuit section is manufactured on said dummy substrate so as to have a first surface constituting a mounting surface for a surface of said base substrate section as an upper layer.

4. The hybrid circuit substrate manufacturing method according to claim 2, wherein said step of releasing said micro interconnect section from said dummy substrate is performed after said micro interconnect circuit section is mounted on either said base substrate section or a surface of said optical interconnect circuit section.

5. A hybrid circuit substrate manufacturing method for manufacturing a hybrid circuit substrate with optical and electrical interconnects, comprising the steps of:

manufacturing a base substrate section having an interconnect layer formed on an insulating substrate using a printed circuit process;

manufacturing a micro interconnect circuit section having a micro electrical interconnect layer which is finer than the interconnect layer of the base substrate section, formed on an insulating resin layer using a semiconductor manufacturing process;

manufacturing an optical interconnect circuit section adapted to transfer and/or receive an optical signal and provided with an optical wave-guide having an input section and an output section for output of an optical signal at opposite ends thereof and an optical element composed of a light emitting device with a light emitting section thereof facing the input section and a photo detecting device with a photo detecting section thereof facing the output section;

forming said optical wave-guide on a release layer on a dummy substrate by operatively stacking core and clad layers on said release layer, wherein said dummy substrate includes one of a silicon substrate and a glass substrate having said release layer formed on a planarized surface thereof;

releasing said optical wave-guide from said dummy substrate using said release layer mounting said micro interconnect circuit section and said optical interconnect circuit section on said base substrate section; and providing transmission channels for an electrical signal and an optical signal.

6. A hybrid circuit substrate manufacturing method for manufacturing a hybrid circuit substrate with optical and electrical interconnects, comprising the steps of:

manufacturing a base substrate section having an interconnect layer formed on an insulating substrate using a printed circuit process;

manufacturing a micro interconnect circuit section with upper and lower surfaces and having a micro electrical interconnect layer which is finer than the interconnect layer of the base substrate section, formed on an insulating resin layer using a semiconductor manufacturing process;

manufacturing said micro interconnect circuit section by forming an insulation resin layer on a release layer of a dummy substrate, wherein said dummy substrate comprises one of a silicon substrate and a glass substrate having a release layer formed on a planarized surface thereof, and then forming said micro interconnect circuit section on said insulation resin layer by a semiconductor process with said lower surface facing said dummy substrate;

manufacturing an optical interconnect circuit section adapted to transfer and/or receive an optical signal and provided with an optical wave-guide having an input section and an output section for output of an optical signal at opposite ends thereof and an optical element composed of a light emitting device with a light emitting section thereof facing the input section and a photo detecting device with a photo detecting section thereof facing the output section;

manufacturing said optical interconnect circuit section by forming said optical wave-guide on a release layer of other dummy substrate comprising one of a silicon substrate and a glass substrate having a release layer formed on a planarized surface thereof, said optical wave-guide having an upper surface, said optical wave-guide having a lower surface facing said another dummy substrate;

joining said micro interconnect circuit section with said optical wave-guide using their respective upper surfaces as joining surfaces;

releasing said dummy substrate from one of said micro interconnect circuit section and said optical wave-guide via its respective release layer, the resulting dummy substrate free lower surface being a released surface;

mounting said joined micro interconnect circuit section and said optical wave-guide on a surface of said base substrate section using said released surface of said one of said micro interconnect circuit section and said optical wave-guide as a mounting surface; and releasing said other dummy substrate from said other of said micro interconnect circuit section and said optical wave-guide using its respective release layer.

7. A hybrid circuit substrate manufacturing method for manufacturing a hybrid circuit substrate with optical and electrical interconnects, comprising the steps of:

manufacturing a base substrate section having an interconnect layer formed on an insulating substrate using a printed circuit process;

manufacturing a micro interconnect circuit section having a micro electrical interconnect layer using a semiconductor process;

manufacturing said micro interconnect circuit section by forming an insulation resin layer on a release layer of a dummy substrate, wherein said dummy substrate comprises one of a silicon substrate and a glass substrate having a release layer formed on a planarized surface thereof; and forming said micro interconnect circuit section by including at least one micro electric interconnect layer which is finer than a interconnect layer of said base circuit section, on said insulation resin layer by a semiconductor process;

manufacturing an optical interconnect circuit section adapted to transfer and/or receive an optical signal and provided with an optical wave-guide having an input section and an output section of a optical signal at opposite ends thereof; and an optical element composed of a light emitting device with a light emitting section thereof facing the input section and a photo detecting device with a photo detecting section thereof facing the output section;

manufacturing said optical interconnect circuit section by forming said optical wave-guide guide on a release layer of another dummy substrate comprising one of a silicon substrate and a glass substrate having a release layer formed on a planarized surface thereof, said optical wave-guide having upper and lower surfaces;

joining said micro interconnect circuit section with said optical wave-guide using respective upper surfaces as joining surfaces;

releasing said another dummy substrate from said optical interconnect circuit section via its respective releasing layer and mounting an optical element on said surface from which said another dummy substrate was released;

forming a connecting pad constituting a connecting terminal for electrically connecting an uppermost exposed layer of said micro interconnect circuit section with said base substrate section;

forming an insulation layer on said uppermost exposed layer of said micro interconnect circuit section so as to coat said exposed optical interconnect circuit section and said connecting pad;

polishing said insulation layer so as to expose said optical element and said connecting pad;

connecting and mounting on a surface of said base substrate section said connecting terminal and said optical element to said interconnection layer using said insulation layer as a mounting surface;

releasing said dummy substrate of said micro interconnect circuit section side via said releasing layer;

mounting said micro interconnect circuit section and said optical interconnect circuit section on said base substrate section; and providing transmission channels for an electrical signal and an optical signal, wherein, said optical interconnect circuit section is mounted between said micro interconnect circuit section and said base substrate section.

8. A hybrid circuit module manufacturing method for manufacturing a hybrid circuit substrate with optical and electrical interconnects, comprising the steps of:

manufacturing a base substrate section having an interconnect layer formed on an insulating substrate using a printed circuit process;

manufacturing a micro interconnect circuit section having a micro electrical interconnect layer which is finer than the interconnect layer of the base substrate section, using a semiconductor process by (a) forming an insulation resin layer on a release layer of a dummy substrate, wherein said dummy substrate includes one of a silicon substrate and a glass substrate having a release layer formed on a planarized surface thereof;

(b) forming said micro interconnect circuit section by including at least one micro electric interconnect layer which is finer than a interconnect layer of said base circuit section, on said insulation resin layer by a semiconductor process; and (c) releasing said micro interconnect circuit section from said dummy substrate via said release layer;

manufacturing an optical interconnect circuit section adapted to transfer and/or receive an optical signal and provided with an optical wave-guide having an input section and an output section of a optical signal at opposite ends thereof; and an optical element composed of a light emitting device with a light emitting section thereof facing the input section and a photo detecting device with a photo detecting section thereof facing the output section;

mounting said micro interconnect circuit section and said optical interconnect circuit section on said base substrate section; and mounting electronic components and semiconductor chips on a surface of one of said base substrate section, said micro interconnect circuit section and said optical interconnect circuit section, wherein, said hybrid circuit substrate comprises transmission channels for an optical signal and an electric signal for optically transmitting an information signal between at least a pair of said semiconductor chips mounted on said micro electric interconnect layer, via said optical element and said optical wave-guide.

9. A hybrid circuit module manufacturing method for manufacturing a hybrid circuit substrate with optical and electrical interconnects, comprising the steps of: manufacturing a base substrate section having an interconnect layer formed on an insulating substrate by a printed circuit process;

manufacturing a micro interconnect circuit section having a micro electrical interconnect layer which is finer than the interconnect layer of the base substrate section, formed on an insulating resin layer by a semiconductor process; and manufacturing an optical interconnect circuit section adapted to transfer and/or receive an optical signal and provided with an optical wave-guide having an input section and an output section of a optical signal at opposite ends thereof; and an optical element composed of a light emitting device with a light emitting section thereof facing the input section and a photo detecting device with a photo detecting section thereof facing the output section;

forming said optical wave-guide on a release layer of a dummy substrate by packing a core material by means of a clad material, wherein said dummy substrate includes one of a silicon substrate and a glass substrate having a release layer formed on a planarized surface thereof;

releasing said optical wave-guide from said dummy substrate via said release layer mounting said micro interconnect circuit section and said optical interconnect circuit section on said base substrate section; and mounting electronic components and semiconductor chips on a surface of one of said base substrate section, said micro interconnect circuit section and said optical interconnect circuit section, wherein, said hybrid circuit substrate comprises transfer channels for an optical signal and an electric signal for optically transferring an information signal between at least a pair of said semiconductor chips mounted on said micro electric interconnect layer, via said optical element and said optical wave-guide.

10. A hybrid circuit module manufacturing method for manufacturing a hybrid circuit substrate with optical and electrical interconnects, comprising the steps of:

manufacturing a base substrate section having an interconnect layer formed on an insulating substrate using a printed circuit process;

manufacturing a micro interconnect circuit section having a micro electrical interconnect layer which is finer than the interconnect layer of the base substrate section, formed on an insulating resin layer using a semiconductor process;

manufacturing said micro interconnect circuit section by forming an insulation resin layer on a release layer of a dummy substrate, wherein said dummy substrate comprises one of a silicon substrate and a glass substrate having a release layer formed on a planarized surface thereot and forming said micro interconnect circuit section by including at least one micro electric interconnect layer which is finer than a interconnect layer of said base circuit section, on said insulation resin layer using a semiconductor process;

manufacturing an optical interconnect circuit section adapted to transfer and/or receive an optical signal and provided with an optical wave-guide having an input section and an output section of a optical signal at opposite ends thereof; and an optical element composed of a light emitting device with a light emitting section thereof facing the input section and a photo detecting device with a photo detecting section thereof facing the output section;

manufacturing said optical interconnect circuit section by forming said optical wave-guide on said a release layer by utilizing another dummy substrate comprising one of a silicon substrate and a glass substrate having a release layer formed on a planarized surface thereof;

mounting said micro interconnect circuit section and said optical interconnect circuit section on said base substrate section; and mounting electronic components and semiconductor chips on a surface of one of said base substrate section, said micro interconnect circuit section and said optical interconnect circuit section;

joining said micro interconnect circuit section with said optical interconnect circuit section using respective uppermost layers as joining surfaces;

releasing one of said dummy substrates from one of said micro interconnect circuit section and said optical interconnect circuit section via its respective release layer;

mounting on a surface of said base substrate section using said surface of said one of said micro interconnect circuit section and said optical interconnect circuit section from which said dummy substrate was released as a mounting surface; and releasing said other dummy substrate from one of said micro interconnect circuit section and said optical interconnect circuit section being hold by said other dummy substrate via said releasing layer, wherein, said hybrid circuit substrate comprises transfer channels for an optical signal and an electric signal for optically transferring an information signal between at least a pair of said semiconductor chips mounted on said micro electric interconnect layer, via said optical element and said optical wave-guide.

11. A hybrid circuit module manufacturing method for manufacturing a hybrid circuit substrate with optical and electrical interconnects, comprising the steps of:

manufacturing a base substrate section having an interconnect layer formed on an insulating substrate using a printed circuit process;

manufacturing a micro interconnect circuit section having a micro electrical interconnect layer which is finer than the interconnect layer of the base substrate section, formed on an insulating resin layer using a semiconductor process;

manufacturing said micro interconnect circuit section by forming an insulation resin layer on a release layer of a dummy substrate, wherein said dummy substrate comprises one of a silicon substrate and a glass substrate having a release layer formed on a planarized surface thereot and forming said micro interconnect circuit section by including at least one micro electric interconnect layer which is finer than a interconnect layer of said base circuit section, on said insulation resin layer by a semiconductor process;

manufacturing an optical interconnect circuit section adapted to transfer and/or receive an optical signal and provided with an optical wave-guide having an input section and an output section of a optical signal at opposite ends thereof; and an optical element composed of a light emitting device with a light emitting section thereof facing the input section and a photo detecting device with a photo detecting section thereof facing the output section;

manufacturing said optical interconnect circuit section by forming said optical wave-guide on said release layer by utilizing a dummy substrate comprising one of a silicon substrate and a glass substrate having a release layer formed on a planarized surface thereof;

joining said micro interconnect circuit section with said optical interconnect circuit section using respective uppermost layers as joining surfaces while being held by respective dummy substrates;

releasing said dummy substrate from said optical interconnect circuit section via said release layer and mounting an optical element on said surface from which said dummy substrate was released;

forming a connecting pad constituting a connecting terminal for electrically connecting an uppermost exposed layer of said micro interconnect circuit section with said base substrate section;

forming an insulation layer on said uppermost exposed layer of said micro interconnect circuit section so as to coat said exposed optical interconnect circuit section and said connecting pad;

polishing said insulation layer so as to expose said optical element and said connecting pad;

connecting and mounting on a surface of said base substrate section said connecting terminal and said optical element to said interconnection layer by having said insulation layer as a mounting surface;

releasing said dummy substrate of said micro interconnect circuit section side via said release layer;

mounting said micro interconnect circuit section and said optical interconnect circuit section on said base substrate section; and mounting electronic components and semiconductor chips on a surface of one of said base substrate section, said micro interconnect circuit section and said optical interconnect circuit section, wherein, said hybrid circuit substrate comprises transfer channels for an optical signal and an electric signal for optically transferring an information signal between at least a pair of said semiconductor chips mounted on said micro electric interconnect layer, via said optical element and said optical wave-guide, and said optical interconnect circuit section is mounted between said micro interconnect circuit section and said base substrate section.

* * * * *